US012696777B2

(12) United States Patent
Yoon et al.

(10) Patent No.: US 12,696,777 B2
(45) Date of Patent: Jul. 28, 2026

(54) SEMICONDUCTOR PACKAGE HAVING REDISTRIBUTION STRUCTURE

(71) Applicant: Samsung Electronics Co., Ltd., Suwon-si (KR)

(72) Inventors: Okseon Yoon, Suwon-si (KR); Jiyeong Kim, Cheonan-si (KR); Jinyoung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 941 days.

(21) Appl. No.: 17/823,634

(22) Filed: Aug. 31, 2022

(65) Prior Publication Data

US 2023/0154841 A1 May 18, 2023

(30) Foreign Application Priority Data

Nov. 16, 2021 (KR) ........................ 10-2021-0158039

(51) Int. Cl.
H10W 70/65 (2026.01)
H10W 70/685 (2026.01)
(Continued)

(52) U.S. Cl.
CPC ......... H10W 70/65 (2026.01); H10W 70/685 (2026.01); H10W 90/00 (2026.01); *H10W 74/15* (2026.01); *H10W 90/722* (2026.01); *H10W 90/724* (2026.01); *H10W 90/732* (2026.01); *H10W 90/734* (2026.01)

(58) Field of Classification Search
CPC .............................................. H01L 23/49838
See application file for complete search history.

(56) References Cited

U.S. PATENT DOCUMENTS 8,431,479 B2 4/2013 Kim et al.
8,766,158 B2 7/2014 Arase et al.
(Continued)

FOREIGN PATENT DOCUMENTS

CN 102713687 A 10/2012
KR 101761914 B1 7/2017
(Continued)

OTHER PUBLICATIONS

Office Action for TW Patent Application No. 111138219, mailed Apr. 11, 2024, 7 pages, no translation.

*Primary Examiner* — William A Harriston
(74) *Attorney, Agent, or Firm* — Wolf, Greenfield & Sacks, P.C.

(57) ABSTRACT

A semiconductor package includes: a redistribution structure including a plurality of redistribution insulation layers, which are stacked, a plurality of redistribution line patterns on an upper surface and a lower surface of the plurality of redistribution insulation layers, and constituting a plurality of distribution layers at different vertical levels from each other, and a plurality of redistribution vias that penetrate at least one redistribution insulation layer of the plurality of redistribution insulation layers and are connected to some of the plurality of redistribution line patterns; and at least one semiconductor chip on the redistribution structure and electrically connected to the plurality of redistribution line patterns and the plurality of redistribution vias.

20 Claims, 15 Drawing Sheets

(51) Int. Cl.
  *H10W 74/15*       (2026.01)
  *H10W 90/00*       (2026.01)

(56)              References Cited

U.S. PATENT DOCUMENTS

| | | | | |
|---|---|---|---|---|
| 10,515,921 | B2 * | 12/2019 | Yu ........................ | H10W 74/117 |
| 10,622,273 | B2 * | 4/2020 | Choi .................... | H10W 74/117 |
| 10,714,361 | B2 | 7/2020 | Kim et al. | |
| 11,581,262 | B2 | 2/2023 | Patil et al. | |
| 2011/0189597 | A1 * | 8/2011 | Hsieh ........................ | G03F 7/20 |
| | | | | 430/326 |
| 2017/0221837 | A1 * | 8/2017 | Hedrick .............. | H10W 42/121 |
| 2020/0043840 | A1 * | 2/2020 | Kim ...................... | H10W 70/05 |
| 2020/0203283 | A1 | 6/2020 | Lee et al. | |
| 2020/0294901 | A1 | 9/2020 | Strong et al. | |
| 2021/0104467 | A1 * | 4/2021 | Patil ..................... | H10W 70/09 |
| 2021/0343651 | A1 * | 11/2021 | Tsai ..................... | H10W 70/05 |
| 2023/0317625 | A1 * | 10/2023 | Kim ................... | H10W 70/611 |
| | | | | 257/668 |

FOREIGN PATENT DOCUMENTS

| | | | |
|---|---|---|---|
| KR | 10-2020-0014087 | A | 2/2020 |
| KR | 10-2021-0034146 | A | 3/2021 |
| TW | 202005033 | A | 1/2020 |
| TW | 202117957 | A | 5/2021 |

* cited by examiner

SEMICONDUCTOR PACKAGE HAVING REDISTRIBUTION STRUCTURE

CROSS-REFERENCE TO RELATED APPLICATION

This application is based on and claims priority under 35 U.S.C. § 119 to Korean Patent Application No. 10-2021-0158039, filed on Nov. 16, 2021 in the Korean Intellectual Property Office, the disclosure of which is incorporated by reference herein in its entirety.

BACKGROUND

The inventive concept relates to a semiconductor package, and more particularly, to a semiconductor package having a redistribution structure.

In response to the rapid development of the electronic industry and the needs of users, electronic devices are becoming more miniaturized and multi-functional, and have a larger capacity, and accordingly, highly integrated semiconductor chips are required. Accordingly, a semiconductor package with a redistribution layer replacing a printed circuit board or a redistribution structure such as a redistribution interposer replacing a silicon interposer is being developed for a highly integrated semiconductor chip with an increased number of connection terminals for input/output (I/O).

SUMMARY

The inventive concept provides a semiconductor package having a redistribution structure capable of implementing a fine pattern for highly integrated semiconductor chips.

The inventive concept provides a semiconductor package as follows.

According to an aspect of the inventive concept, there is provided a semiconductor package including: a redistribution structure including a plurality of distribution layers at different vertical levels from each other, the plurality of distribution layers including a plurality of redistribution insulation layers, which are stacked, and a plurality of redistribution line patterns on upper and lower surfaces of the plurality of redistribution insulation layers, the redistribution structure further comprising a plurality of redistribution vias that penetrate at least one redistribution insulation layer of the plurality of redistribution insulation layers and are connected to some of the plurality of redistribution line patterns; and at least one semiconductor chip on the redistribution structure and electrically connected to the plurality of redistribution line patterns and the plurality of redistribution vias, wherein the plurality of redistribution line patterns include a plurality of upper redistribution line patterns on a first distribution layer of the plurality of distribution layers and lower redistribution line patterns on a second redistribution layer of the plurality of distribution layers at a lower vertical level than the first distribution layer, and wherein at least one of the plurality of redistribution insulation layers covers the lower redistribution line patterns, and includes an upper surface including a reference surface, a first outer surface extending away from the reference surface and having a lower vertical level than the reference surface, a first downward step between the reference surface and the first outer surface, a second outer surface extending away from the first outer surface and having a lower vertical level than the first outer surface, and a second downward step between the first outer surface and the second outer surface.

According to another aspect of the inventive concept, there is provided a semiconductor package including: a redistribution structure including a plurality of redistribution insulation layers, which are stacked and include a first insulation layer which is an uppermost one of the plurality of redistribution insulation layers and a second insulation layer under the first insulation layer, a plurality of redistribution line patterns constituting a plurality of distribution layers including a first distribution layer on an upper surface of the first insulation layer, a second distribution layer between the first insulation layer and the second insulation layer, and a third distribution layer arranged on a lower surface of the second insulation layer, and a plurality of redistribution vias that penetrate at least one of the plurality of redistribution insulation layers and are connected to some of the plurality of redistribution line patterns; at least one stacked structure on the redistribution structure, and including a first semiconductor chip and a plurality of second semiconductor chips stacked on the first semiconductor chip; and a third semiconductor chip on the redistribution structure and spaced apart from the at least one stacked structure in a horizontal direction, wherein an upper surface of the second insulation layer has a stepped shape, in which three or more portions at different vertical levels from each other have steps therebetween.

According to another aspect of the inventive concept, there is provided a semiconductor package including: a package base substrate; a redistribution structure including a plurality of redistribution insulation layers, which are stacked on the package base substrate, a first distribution layer on an upper surface of a first insulation layer uppermost of the plurality of redistribution insulation layers, a second distribution layer arranged between the first insulation layer and a second insulation layer under the first insulation layer of the plurality of redistribution insulation layers, a plurality of redistribution line patterns constituting a plurality of distribution layers including a third distribution layer arranged on a lower surface of the second insulation layer, and a plurality of redistribution vias that penetrate at least one redistribution insulation layer of the plurality of redistribution insulation layers and are connected to some of the plurality of redistribution line patterns; at least one stacked structure including a first semiconductor chip on the redistribution structure and including a plurality of first front surface connection pads, and a plurality of second semiconductor chips stacked on the first semiconductor chip; a third semiconductor chip spaced apart from the at least one stacked structure in a horizontal direction, on the redistribution structure, and including a plurality of second front surface connection pads; and a plurality of redistribution upper surface pads on the first distribution layer, of the plurality of redistribution line patterns, and a plurality of first chip connection terminals and a plurality of second chip connection terminals respectively disposed between the plurality of first front surface connection pads and the plurality of second front surface connection pads, wherein an upper surface of the second insulation layer includes a reference surface on a central portion of any one of the lower redistribution line patterns, a first outer surface extending away from the reference surface and having a lower vertical level than the reference surface, a first downward step between the reference surface and the first outer surface, a second outer surface extending away from the first outer surface and having a lower vertical level than the first outer surface, a second downward step between the first outer surface and the second outer surface, a third outer surface extending away from the second outer surface and having a lower vertical level than the second outer surface, and a third downward step between the second outer surface and the third outer surface.

BRIEF DESCRIPTION OF THE DRAWINGS

Embodiments of the inventive concept will be more clearly understood from the following detailed description taken in conjunction with the accompanying drawings in which:

FIG. 1 is a cross-sectional view of a semiconductor package according to an example embodiment;

Figure 2A:
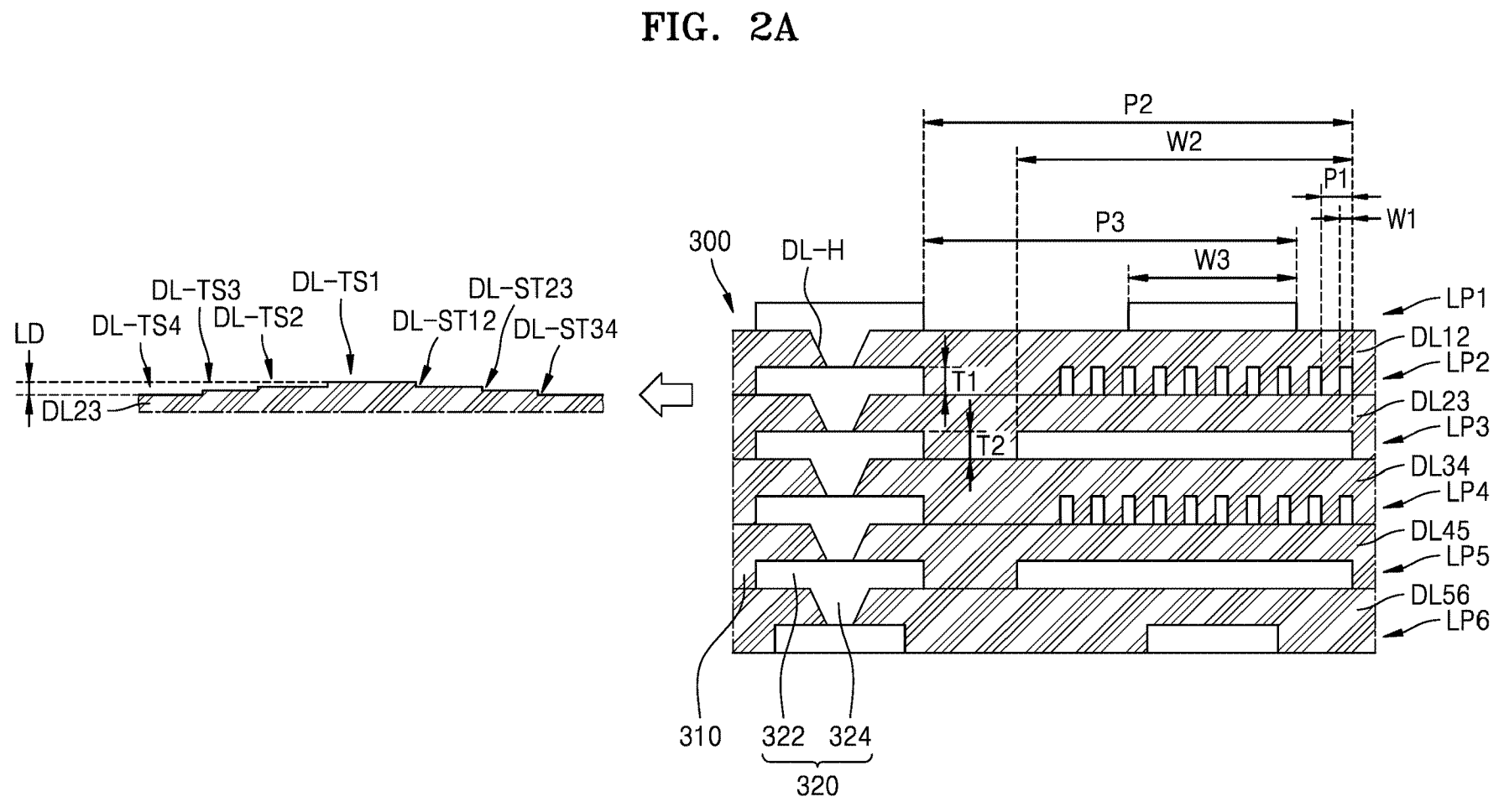

FIGS. 2A through 2D are conceptual cross-sectional views of a redistribution structure included in a semiconductor package, according to example embodiments;

FIG. 6 is a cross-sectional view of a semiconductor package of a package on package type, according to an example embodiment.

DETAILED DESCRIPTION

Figure 1:
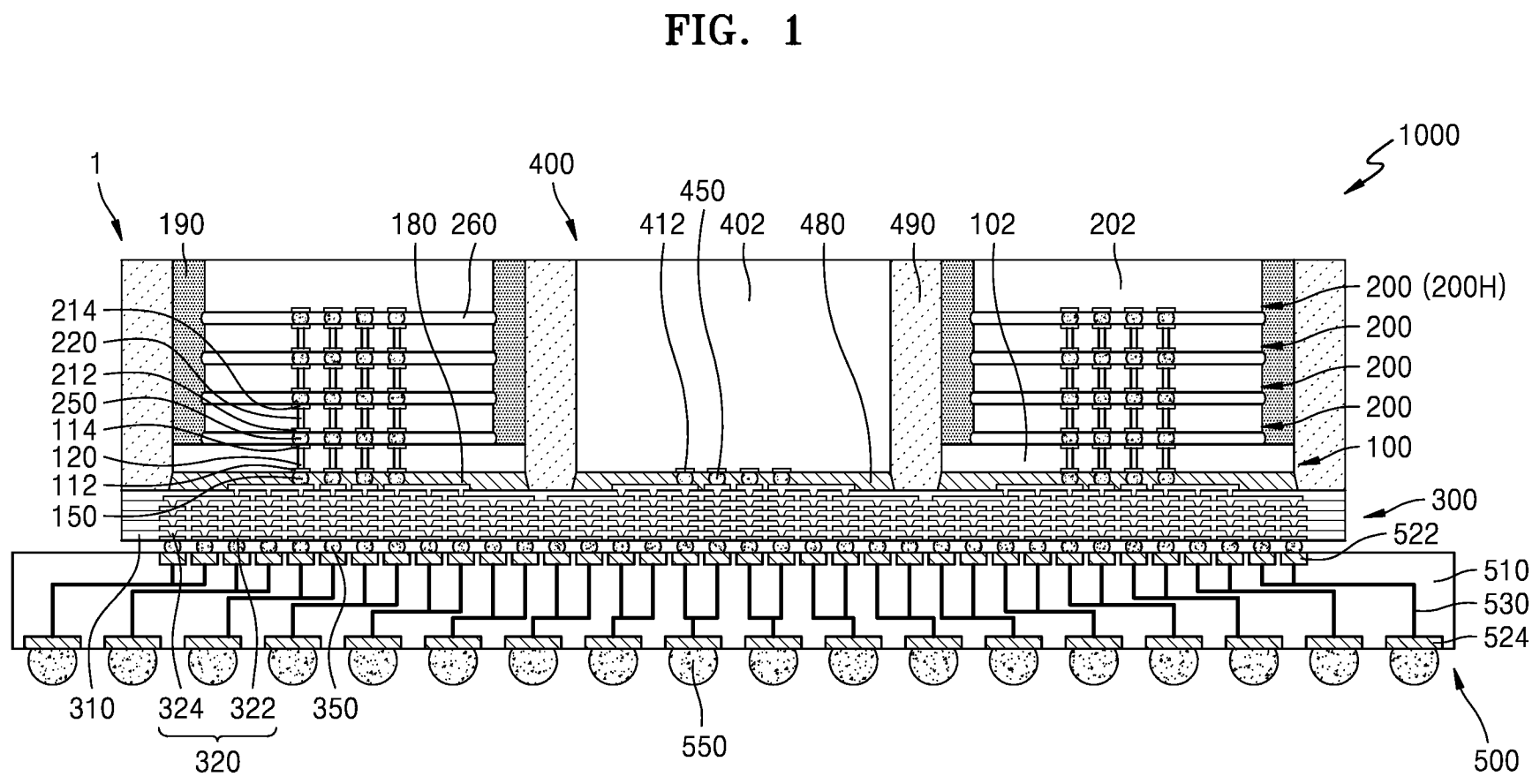
Figure 2B:
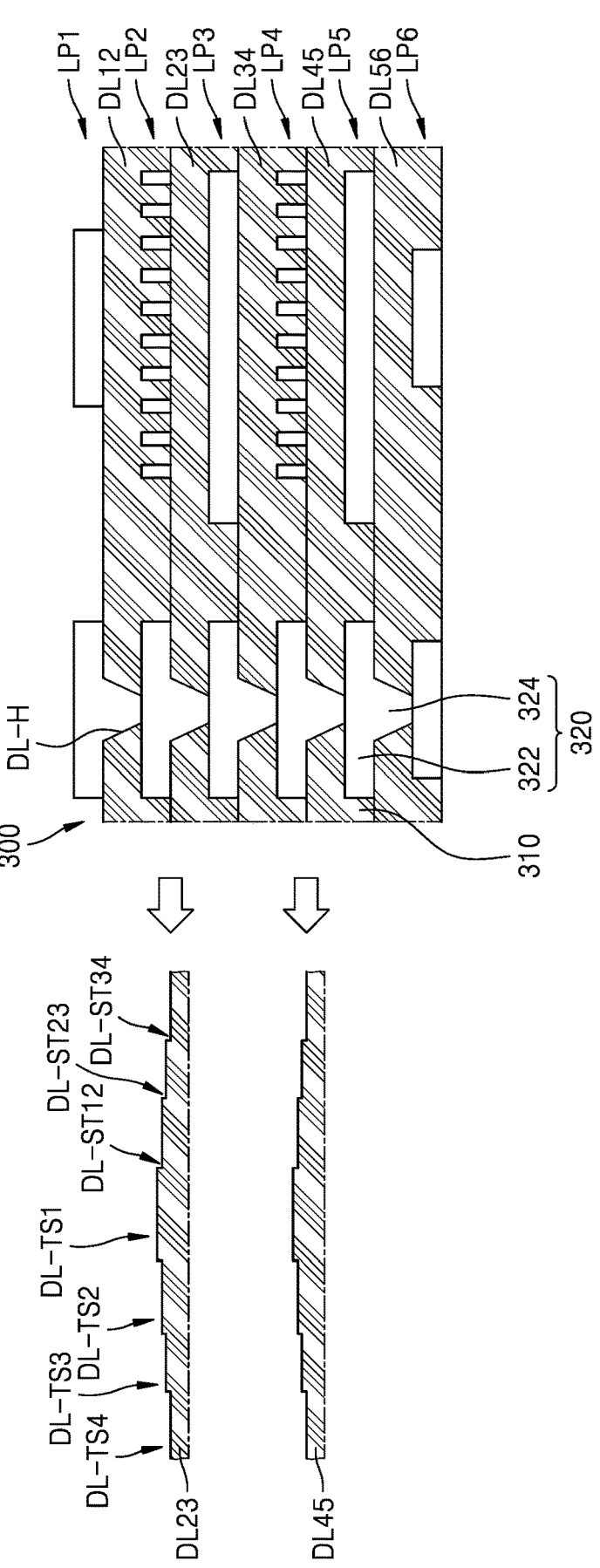

FIG. 1 is a cross-sectional view of a semiconductor package 1000 according to an example embodiment.

Referring to FIG. 1, the semiconductor package 1000 may include a package base substrate 500, a redistribution structure 300 on (e.g., attached on) the package base substrate 500, at least one stacked structure 1 including a first semiconductor chip 100 on (e.g., attached on) the redistribution structure 300 and a plurality of second semiconductor chips 200 stacked on the first semiconductor chip 100, and a third semiconductor chip 400 on (e.g., attached on) the redistribution structure 300. The at least one stacked structure 1 and the third semiconductor chip 400 may be spaced apart from each other in a horizontal direction, and may be on (e.g., attached on) the redistribution structure 300.

In FIG. 1, the semiconductor package 1000 is illustrated as including two stacked structures 1 on (e.g., attached on) the redistribution structure 300, but is not limited thereto. For example, the semiconductor package 1000 may include one, two, four, six, eight, or more stacked structures 1. The stacked structure 1 may be referred to as a memory stack, and the third semiconductor chip 400 may be referred to as a logic semiconductor chip.

The package base substrate 500 may include a base board layer 510, and a plurality of (board) upper surface pads 522 and a plurality of (board) lower surface pads 524, which are respectively arranged on an upper surface and a lower surface of the base board layer 510. The package base substrate 500 may include a plurality of board wiring paths 530 electrically connecting the plurality of board upper surface pads 522 to the plurality of board lower surface pads 524 via the base board layer 510. In some embodiments, the package base substrate 500 may include a printed circuit board. For example, the package base substrate 500 may include a multi-layer printed circuit board.

The base board layer 510 may include at least one material selected from phenol resin, epoxy resin, and polyimide. For example, the base board layer 510 may include at least one material selected from frame retardant 4 (FR4), tetrafunctional epoxy, polyphenylene ether, epoxy/polyphenylene oxide, bismaleimide triazine (BT), thermount, cyanate ester, polyimide, and liquid crystal polymer. In some embodiments, the base board layer 510 may include, for example, polyester (PET), PET terephthalate, fluorinated ethylene propylene (FEP), a resin-coated paper, liquid polyimide resin, a polyethylene naphthalate (PEN) film, etc. The base board layer 510 may be formed by stacking a plurality of base layers.

The plurality of board upper surface pads 522 and the plurality of board lower surface pads 524 may include copper, nickel, stainless steel, or beryllium copper. For example, the plurality of board upper surface pads 522 and the plurality of board lower surface pads 524 may include coated copper. In some embodiments, on outer surface portions of the plurality of board upper surface pads 522 and the plurality of board lower surface pads 524 of the base board layer 510, nickel/gold (Ni/Au), or the like may be included.

The plurality of board wiring paths 530 may include a plurality of filled conductive layers extending in the horizontal direction and a plurality of conductive vias extending in a vertical direction. The plurality of conductive vias may connect two elements, which are at different vertical levels from each other, among the plurality of filled conductive layers, the plurality of board upper surface pads 522, and the plurality of board lower surface pads 524. The plurality of board wiring paths 530 may include, for example, electronically deposited (ED) copper, rolled-annealed (RA) copper foil, stainless steel foil, aluminum foil, ultra-thin copper foil, sputtered copper, an copper alloy, Ni, stainless steel, beryllium copper, etc.

The base board layer 510 may further include a solder resist layer, which exposes the plurality of board upper surface pads 522 and the plurality of board lower surface pads 524 on an upper surface and a lower surface of the base board layer 510, respectively. The solder resist layer may include a polyimide film, a polyester film, a flexible solder mask, photo-imageable coverlay (PIC), photo-imageable solder resist, etc. The solder resist layer may be formed by, for example, curing doped thermosetting ink by using a silk screen printing method or an inkjet method. The solder resist layer may be formed by, for example, removing a portion of the photo-imageable solder resist, doped by a screen method or a spray coating method, by using exposure and development processes and curing the photo-imageable solder resist. The solder resist layer may be formed by, for example, laminating a polyimide film or a polyester film.

A plurality of package connection terminals 350 may be connected to the plurality of board upper surface pads 522, and a plurality of external connection terminals 550 may be connected to the plurality of board lower surface pads 524. The plurality of package connection terminals 350 may electrically connect the redistribution structure 300 and the package base substrate 500. The plurality of external connection terminals 550 connected to the plurality of board lower surface pads 524 may connect (e.g., electrically connect) the semiconductor package 1000 to the outside. In some embodiments, each of the plurality of package connection terminals 350 and the plurality of external connection terminals 550 may include a bump, a solder ball, etc.

In some embodiments, the redistribution structure 300 may include an interposer, for example, a redistribution layer (RDL) interposer. The redistribution structure 300 may include a redistribution insulation layer 310 and a plurality of redistribution patterns 320.

In some embodiments, the redistribution structure 300 may include the plurality of redistribution insulation layers 310, which are stacked on each other. The redistribution insulation layer 310 may be formed by using, for example, photo imageable dielectric (PID) or photosensitive polyimide (PSPI). An upper surface of at least one redistribution insulation layer 310 of the plurality of redistribution insulation layers 310 may have a step shape, in which three or more portions thereof at different vertical levels from each other have or define two or more steps. For example, the upper surface of at least one redistribution insulation layer 310 of the plurality of redistribution insulation layers 310 may include a reference surface and at least two outer surfaces, which have steps from the reference surface toward the outside at step-down vertical levels, and thus, may have a relatively improved flatness. The shape of the upper surface of the plurality of redistribution insulation layers 310 is described in detail with reference to FIGS. 2A through 2D.

The plurality of redistribution patterns 320 may include a plurality of redistribution line patterns 322 and a plurality of redistribution vias 324. The plurality of redistribution patterns 320 including the plurality of redistribution line patterns 322 and the plurality of redistribution vias 324 may include, for example, a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof, but are not limited thereto. In some embodiments, the plurality of redistribution patterns 320 may be formed by stacking a metal or an alloy of a metal on a seed layer including Ti, titanium nitride, or titanium tungsten.

A plurality of redistribution line patterns 322 may be arranged on least one of the upper surface and a lower surface of the redistribution insulation layer 310. Each of the plurality of redistribution vias 324 may penetrate at least one redistribution insulation layer 310, and be in contact with and connected to some of the plurality of redistribution line patterns 322. In some embodiments, at least some of the plurality of redistribution line patterns 322 may be formed in one body together with some of the plurality of redistribution vias 324. For example, the redistribution line pattern 322 and the redistribution via 324 contacting an upper surface of the redistribution line pattern 322 may be formed in one body.

In some embodiments, the plurality of redistribution vias 324 may have a tapered shape, in which a horizontal width thereof increases and extends from a lower side or end thereof to an upper side or end thereof. In other words, the horizontal width of the plurality of redistribution vias 324 may increase, as the plurality of redistribution vias 324 extend away from the package base substrate 500 or toward the at least one stacked structure 1 and the third semiconductor chip 400.

Some of the plurality of redistribution line patterns 322 arranged on the upper surface of the redistribution structure 300 may be referred to as redistribution upper surface pads, and some of the plurality of redistribution line patterns 322 arranged on the lower surface of the redistribution structure 300 may be referred to as redistribution lower surface pads. A plurality of first chip connection terminals 150 and a plurality of third chip connection terminals 450 may be attached to a plurality of the redistribution upper surface pads, and the plurality of package connection terminals 350 may be attached to a plurality of the redistribution lower surface pads. In some embodiments, each of the plurality of first chip connection terminals 150 and the plurality of third chip connection terminals 450 may include a bump, a solder ball, etc. A first underfill layer 180 surrounding the plurality of first chip connection terminals 150 may be arranged between the redistribution structure 300 and the stacked structure 1, and a second underfill layer 480 surrounding the plurality of third chip connection terminals 450 may be arranged between the redistribution structure 300 and the third semiconductor chip 400. The first underfill layer 180 and the second underfill layer 480 may include epoxy resin formed by, for example, a capillary underfill method. In some embodiments, the first underfill layer 180 and the second underfill layer 480 may include a non-conductive film (NCF).

The stacked structure 1 may include the first semiconductor chip 100 and the plurality of second semiconductor chips 200. In FIG. 1, the at least one stacked structure 1 is illustrated as including one first semiconductor chip 100 and four second semiconductor chips 200, but is not limited thereto. For example, the at least one stacked structure 1 may include two or more second semiconductor chips 200. In some embodiments, the at least one stacked structure 1 may include a multiple of four second semiconductor chips 200. The plurality of second semiconductor chips 200 may be sequentially stacked on the first semiconductor chip 100 in the vertical direction. Each of the first semiconductor chip 100 and the plurality of second semiconductor chips 200 may be sequentially stacked with an active surface thereof downward, that is, facing toward the redistribution structure 300.

The first semiconductor chip 100 and a plurality of second semiconductor chips 200 may include, for example, dynamic random-access memory (RAM) (DRAM), static RAM (SRAM), flash memory, electrically erasable and programmable RAM (EEPROM), phase-change RAM (PRAM), magnetic RAM (MRAM), or resistive RAM (RRAM).

In some embodiments, the first semiconductor chip 100 may not include a memory cell. The first semiconductor chip 100 may include a test logic circuit such as a serial-parallel conversion circuit, a design for test (DFT) circuit, a joint test action group (JTAG) circuit, and a memory built-in self-test (MBIST) circuit, and a signal interface circuit such as a physical layer (PHY) circuit. The plurality of second semiconductor chips 200 may include a memory cell. For example, the first semiconductor chip 100 may include a buffer chip for controlling the plurality of second semiconductor chips 200.

In some embodiments, the first semiconductor chip 100 may include a buffer chip for controlling high bandwidth memory (HBM) DRAM, and the plurality of second semiconductor chips 200 may include a memory cell chip including a cell, which includes HBM DRAM controlled by the first semiconductor chip 100. The first semiconductor chip 100 may be referred to as a buffer chip or a master chip, and the second semiconductor chip 200 may be referred to as a slave chip or a memory cell chip. The stacked structure 1 including the first semiconductor chip 100 and the plurality of second semiconductor chips 200 sequentially stacked on the first semiconductor chip 100 may be referred to as an HBM DRAM element.

The first semiconductor chip 100 may include a first substrate 102, a plurality of first front surface connection pads 112, a plurality of first rear surface connection pads 114, and a plurality of first through electrodes 120. A second semiconductor chip 200 may include a second substrate 202, a plurality of second front surface connection pads 212, a plurality of second rear surface connection pads 214, and a plurality of second through electrodes 220.

The first substrate 102 and the second substrate 202 may include silicon (Si). Alternatively, the first substrate 102 and the second substrate 202 may include a semiconductor element such as germanium (Ge), or a compound semiconductor such as silicon carbide (SiC), gallium arsenide (GaAs), indium arsenide (InAs), and indium phosphide (InP). The first substrate 102 and the second substrate 202 may include an active surface and an inactive surface opposite to the active surface. The first substrate 102 and the second substrate 202 may include various types of plurality of individual elements on the active surface thereof. The plurality of individual elements may include various microelectronic elements, for example, a metal-oxide-semiconductor field effect transistor (MOSFET) such as a complementary metal-oxide semiconductor (CMOS) transistor, an image sensor such as a system large scale integration (LSI) sensor and a CMOS imaging sensor (CIS), a micro-electromechanical system (MEMS), an active element, a passive element, etc. The active surface and the inactive surface of the first substrate 102 may be referred to as a first active surface and a first inactive surface, respectively, and the active surface and an inactive surface of the second substrate 202 may be referred to as a second active surface and a second inactive surface, respectively.

The first semiconductor chip 100 and the second semiconductor chip 200 may include a first semiconductor element and a second semiconductor element, which are constituted by the plurality of individual elements. The first semiconductor element may be formed on the first active surface of the first substrate 102, each of the plurality of first front surface connection pads 112 and the plurality of first rear surface connection pads 114 may be arranged on the first active surface and the first inactive surface of the first substrate 102, respectively, and the plurality of first through electrodes 120 may vertically penetrate at least a portion of the first substrate 102 and electrically connect the plurality of first front surface connection pads 112 to the plurality of first rear surface connection pads 114.

The second semiconductor element may be formed on the second active surface of the second substrate 202, each of the plurality of second front surface connection pads 212 and the plurality of second rear surface connection pads 214 may be arranged on the second active surface and the second inactive surface of the second substrate 202, respectively, and the plurality of second through electrodes 220 may vertically penetrate at least a portion of the second substrate 202 and electrically connect the plurality of second front surface connection pads 212 to the plurality of second rear surface connection pads 214. The plurality of second through electrodes 220 may be electrically connected to the plurality of first through electrodes 120.

The stacked structure 1 may be electrically connected to the redistribution structure 300 via the plurality of first front surface connection pads 112. In some embodiments, the plurality of first chip connection terminals 150 may be arranged between the plurality of redistribution upper surface pads among the plurality of first front surface connection pads 112 and the plurality of redistribution line patterns 322, and electrically connect the plurality of first front surface connection pads 112 to the plurality of redistribution upper surface pads. A plurality of second chip connection terminals 250 may be attached on the plurality of second front surface connection pads 212 of each of the plurality of second semiconductor chips 200. The plurality of second chip connection terminals 250 may be arranged between the plurality of first rear surface connection pads 114 of the first semiconductor chip 100 and the plurality of second front surface connection pads 212 of the second semiconductor chip 200 arranged at the lowermost end of the plurality of second semiconductor chips 200, and between the plurality of second front surface connection pads 212 of the remaining second semiconductor chips 200 of the plurality of second semiconductor chips 200 and the plurality of second rear surface connection pads 214 of the other second semiconductor chip 200 thereunder, and may electrically connect the first semiconductor chip 100 to the plurality of second semiconductor chips 200. Each of the plurality of second chip connection terminals 250 may include a bump, a solder, etc.

In some embodiments, an uppermost second semiconductor chip 200H of the plurality of second semiconductor chips 200, which is farthest from the first semiconductor chip 100, may not include the second rear surface connection pad 214 and the second through electrode 220. In some embodiments, a thickness of the uppermost second semiconductor chip 200H of the plurality of second semiconductor chips 200, which is farthest from the first semiconductor chip 100, may be greater than a thickness of the other second semiconductor chips 200.

An insulation adhesive layer 260 may be arranged between each of the first semiconductor chip 100 and the plurality of second semiconductor chips 200. The insulation adhesive layer 260 may be attached to the lower surface of each of the plurality of second semiconductor chips 200, and may attach each of the plurality of second semiconductor chips 200 on a lower structure, for example, on the first semiconductor chip 100 or on another second semiconductor chip 200 at a lower side among the plurality of second semiconductor chips 200. The insulation adhesive layer 260 may include the NCF, a non-conductive paste (NCP), insulating polymer, or epoxy resin. The insulation adhesive layer 260 may surround the plurality of second chip connection terminals 250, and fill a space between each of the first semiconductor chip 100 and the plurality of second semiconductor chips 200.

A horizontal width and an area of the first semiconductor chip 100 may be greater than a horizontal width and an area of each of the plurality of second semiconductor chips 200. For example, all of the plurality of second semiconductor chips 200 may overlap the first semiconductor chip 100 in the vertical direction. In some embodiments, all of the plurality of second semiconductor chips 200 may overlap each other or be aligned in the vertical direction. On the upper surface of the first semiconductor chip 100, that is, on the first inactive surface of the first substrate 102, a chip molding member 190 surrounding the plurality of second semiconductor chips 200 and a plurality of insulation adhesive layers 260 may be arranged. The chip molding member 190 may cover or be on the upper surface of the first semiconductor chip 100, that is, the first inactive surface of the first substrate 102, and cover or surround side surfaces of the plurality of second semiconductor chips 200. In some embodiments, the chip molding member 190 may cover the side surfaces of the plurality of second semiconductor chips 200, but may not cover but expose an upper surface of the second semiconductor chip 200H at the uppermost end of the stack, that is, an inactive surface of the second substrate 202 of the second semiconductor chip 200H at the uppermost end of the stack. The chip molding member 190 may include, for example, epoxy mold compound (EMC).

The third semiconductor chip 400 may include one of, for example, a central processing unit (CPU) chip, a graphics processing unit (GPU) chip, an application processor (AP) chip, an application-specific integrated circuit (ASIC), or other processing chips.

The third semiconductor chip 400 may include a third substrate 402 and a plurality of third front surface connection pads 412. The third substrate 402 is generally similar to the first substrate 102 and the second substrate 202, and thus, detailed descriptions thereof are omitted in the interest of brevity. The third substrate 402 may include an active surface and an inactive surface opposite to the active surface. The active surface and the inactive surface of the third substrate 402 may be referred to as a third active surface and a third inactive surface, respectively. The third semiconductor chip 400 may include a third semiconductor element. The third semiconductor element may be formed on the third active surface of the third substrate 402, and the plurality of third front surface connection pads 412 may be arranged on the third active surface of the third substrate 402.

The third semiconductor chip 400 may be electrically connected to the redistribution structure 300 via a plurality of the third front surface connection pads 412. In some embodiments, the plurality of third chip connection terminals 450 may be arranged between the plurality of redistribution upper surface pads among the plurality of third front surface connection pads 412 and the plurality of redistribution line patterns 322, and may electrically connect the plurality of third front surface connection pads 412 to the plurality of redistribution upper surface pads.

The semiconductor package 1000 may further include a package molding layer 490 surrounding the at least one stacked structure 1 and the third semiconductor chip 400 on the redistribution structure 300. The package molding layer 490 may include, for example, EMC. In some embodiments, the package molding layer 490 may not cover the upper surface of the second semiconductor chip 200H at the uppermost end of the stack and an upper surface of the third semiconductor chip 400. For example, the package molding layer 490 may cover or surround side surfaces of the third semiconductor chip 400. In some embodiments, the package molding layer 490 may surround side surfaces of the chip molding member 190 surrounding the plurality of second semiconductor chips 200, and the side surfaces of the first semiconductor chip 100 included in at least one stacked structure 1. For example, the upper surface of the second semiconductor chip 200H at the uppermost end of the stack, an upper surface of the third semiconductor chip 400, and upper surfaces of the chip molding member 190 and the package molding layer 490 may be coplanar with each other. In some other embodiments, the chip molding member 190 may not be individually formed, but may be a portion of the package molding layer 490, and the package molding layer 490 may cover or surround the side surfaces of the first semiconductor chip 100, a portion of the upper surface of the first semiconductor chip 100, and the side surfaces of the plurality of second semiconductor chips 200. For example, the upper surface of the second semiconductor chip 200H at the uppermost end of the stack, the upper surface of the third semiconductor chip 400, and the upper surface of the package molding layer 490 may be coplanar with each other.

In the semiconductor package 1000 according to the inventive concept, because at least one redistribution insulation layer 310 of the plurality of redistribution insulation layers 310 included in the redistribution structure 300 includes a reference surface and at least two outer surfaces, which have a step from the reference surface toward the outside, at step-down vertical levels, and thus, includes an upper surface thereof having a relatively improved flatness, at least a portion of the plurality of redistribution line patterns 322 included in the redistribution structure 300 may be implemented as a fine pattern.

FIGS. 2A through 2D are conceptual cross-sectional views of the redistribution structure 300 included in the semiconductor package 1000, according to example embodiments. Each of FIGS. 2A through 2D is a conceptual diagram of an upper surface shape of at least one of the plurality of redistribution insulation layers 310 included in the redistribution structure 300, but an actual shape of the redistribution structure 300 is not limited thereto, and on the left thereof, a portion of the upper surface of at least one of the plurality of redistribution insulation layers 310 is enlarged and illustrated.

Referring to FIG. 2A, the redistribution structure 300 may include the redistribution insulation layer 310 and the plurality of redistribution patterns 320. For example, the redistribution structure 300 may include the RDL interposer. The redistribution structure 300 may include the plurality of redistribution insulation layers 310, which are stacked on each other. The redistribution insulation layer 310 may include a redistribution through hole DL-H. The redistribution through hole DL-H may penetrate the redistribution insulation layer 310. The plurality of redistribution patterns 320 may include the plurality of redistribution line patterns 322 and the plurality of redistribution vias 324. The plurality of redistribution line patterns 322 may be arranged at least one of the upper surface and a lower surface of the redistribution insulation layer 310. The plurality of redistribution vias 324 may penetrate at least one redistribution insulation layer 310 and each of the plurality of redistribution vias 324 may be in contact with and connected to some of the plurality of redistribution line patterns 322. The redistribution via 324 may fill the redistribution through hole DL-H. In some embodiments, at least some of the plurality of redistribution line patterns 322 may be formed in one body together with some of the plurality of redistribution vias 324. The plurality of redistribution vias 324 may have a tapered shape, in which a horizontal width thereof increases and extends from the lower side or end thereof to the upper side or end thereof.

In some embodiments, the redistribution structure 300 may include five redistribution insulation layers 310, which are stacked on each other, and the plurality of redistribution line patterns 322 may be arranged on the upper surface and the lower surface of the five redistribution insulation layers 310, which are stacked on each other, to constitute six distribution layers, but is not limited thereto. For example, the redistribution structure 300 may include one or more redistribution insulation layers 310 and the plurality of redistribution line patterns 322 constituting distribution layers, the number of which is one more than the number of redistribution insulation layers 310. The distribution layer may be referred to as an area where some of the plurality of redistribution line patterns 322 extend in the horizontal direction at substantially identical vertical levels, for example, on any one of the upper surface and the lower surface of the redistribution insulating layer 310 included in the redistribution structure 300, and each of the plurality of distribution layers may be at different vertical levels from each other.

The plurality of redistribution insulation layers 310 may include a first insulation layer DL12, a second insulation layer DL23, a third insulation layer DL34, a fourth insulation layer DL45, and a fifth insulation layer DL56. The first insulation layer DL12 may be the uppermost redistribution insulation layer 310 of the plurality of redistribution insulation layers 310, and the fifth insulation layer DL56 may be the redistribution insulation layer 310 at the lowermost end of the stack. The second insulation layer DL23 may be under the first insulation layer DL12, the third insulation layer DL34 may be under the second insulation layer DL23, the fourth insulation layer DL45 may be under the third insulation layer DL34, and the fifth insulation layer DL56 may be under the fourth insulation layer DL45. When the plurality of redistribution insulation layers 310 include the five redistribution insulation layers 310, which are stacked on each other, the first insulation layer DL12, the second insulation layer DL23, the third insulation layer DL34, the fourth insulation layer DL45, and the fifth insulation layer DL56 may be redistribution insulation layers 310, which are sequentially arranged from the uppermost end of the five redistribution insulation layers 310 to the lowermost end thereof, but the embodiment is not limited thereto. For example, when the plurality of redistribution insulation layers 310 include five or fewer redistribution insulation layers 310, one or more of the first insulation layer DL12, the second insulation layer DL23, the third insulation layer DL34, the fourth insulation layer DL45, and the fifth insulation layer DL56 may be omitted, and when the plurality of redistribution insulation layers 310 includes six or more redistribution insulation layers 310, additional insulation layer(s) may be further arranged between the first insulation layer DL12 and the fifth insulation layer DL56.

The plurality of redistribution line patterns 322 may constitute six distribution layers including a first distribution layer LP1, a second distribution layer LP2, a third distribution layer LP3, a fourth distribution layer LP4, a fifth distribution layer LP5, and a sixth distribution layer LP6. The first distribution layer LP1 may be the uppermost distribution layer of the plurality of line patterns 322, and the sixth distribution layer LP6 may be a distribution layer at the lowermost end of the plurality of line patterns 322. The redistribution upper surface pad of the plurality of redistribution line patterns 322 may be on the first distribution layer LP1, and the redistribution lower surface pad may be on the sixth distribution layer LP6. The first distribution layer LP1 may be arranged on the first insulation layer DL12, the second distribution layer LP2 may be arranged between the first insulation layer DL12 and the second insulation layer DL23, the third distribution layer LP3 may be arranged between the second insulation layer DL23 and the third insulation layer DL34, the fourth distribution layer LP4 may be arranged between the third insulation layer DL34 and the fourth insulation layer DL45, the fifth distribution layer LP5 may be arranged between the fourth insulation layer DL45 and the fifth insulation layer DL56, and the sixth distribution layer LP6 may be arranged under the fifth insulation layer DL56. For example, when the plurality of redistribution insulation layers 310 include five or fewer redistribution insulation layers 310, one or more of the first distribution layer LP1, the second distribution layer LP2, the third distribution layer LP3, the fourth distribution layer LP4, the fifth distribution layer LP5, and the sixth distribution layer LP6 may be omitted, and when the plurality of redistribution insulation layers 310 include six or more redistribution insulation layers 310, additional distribution layer(s) may also be further arranged between the first distribution layer LP1 and the sixth distribution layer LP6.

An upper surface of at least one redistribution insulation layer 310 of the plurality of redistribution insulation layers 310 may have a step shape, in which three or more portions thereof at different vertical levels from each other have two or more steps. For example, an upper surface of the second insulation layer DL23 of the plurality of redistribution insulation layers 310 may have a step shape, in which three or more portions thereof at different vertical levels from each other have two or more steps.

The upper surface of the second insulation layer DL23 may include a reference surface DL-TS1 and at least two outer surfaces, for example, DL-TS2, DL-TS3, and DL-TS4, which include or define at least two steps, for example, first, second, and third steps DL-ST12, DL-ST23, and DL-ST34, from the reference surface DL-TS1 extending outwardly toward the outside in the horizontal direction, at step-down vertical levels. In FIG. 2A, it is illustrated that the upper surface of the second insulation layer DL23 includes the reference surface DL-TS1, and the first outer surface DL-TS2, which includes the first step DL-ST12 from the reference surface DL-TS1 toward the outside in the horizontal direction, at a step-down vertical level, the second outer surface DL-TS3, which includes the second step DL-ST23 from the first outer surface DL-TS2 to the outside in the horizontal direction, at a step-down vertical level, and the third outer surface DL-TS4, which includes the third step DL-ST34 from the second outer surface DL-TS3 to the outside in the horizontal direction, at a step-down vertical level, but the embodiment is not limited thereto. For example, the upper surface of the second insulation layer DL23 may include the reference surface DL-TS1, and two outer surfaces, which include two steps from the reference surface DL-TS1 toward the outer surface in the horizontal direction, at step-down vertical levels, or four or more outer surfaces, which include four or more steps at step-down vertical levels. In some embodiments, the reference surface DL-TS1 may be or include a portion at the highest vertical level of the upper surface of the second insulation layer DL23, the third outer surface DL-TS4 may be or include a portion at the lowest vertical level of the upper surface of the second insulation layer DL23 except for inside surfaces of the redistribution through hole DL-H.

In some embodiments, on the second distribution layer LP2, the redistribution line patterns 322 having a first line width W1 and a first line height T1 may be arranged at a first pitch P1, and on the third distribution layer LP3, the redistribution line patterns 322 having a second line width W2 and a second line height T2 may be arranged at a second pitch P2. The second line width W2 may be more than 10 times larger than the first line width W1. Alternatively, the second pitch P2 may be more than 10 times larger than the first pitch P1. Alternatively, both the second line width W2 and the second pitch P2 may be more than 10 times larger than both the first line width W1 and the first pitch P1. In some embodiments, at least some of the redistribution line patterns 322 on the third distribution layer LP3 may constitute a ground plane layer, to which a ground signal is provided, and at least some of the redistribution line patterns 322 on the second distribution layer LP2 may constitute a signal distribution line, to which a data signal, a control signal, or the like are provided.

In some embodiments, each of the first line width W1 and the first pitch P1 may be several micrometers, and each of the second line width W2 and the second pitch P2 may be several tens of micrometers to several hundreds of micrometers. For example, the first line width W1 may be about 1 μm to about 4 μm, and the first pitch P1 may be about 2 μm to about 8 µm. The first thickness T1 may be similar to or somewhat larger than the second thickness T2. The second thickness T2 may be larger than the first line width W1. For example, the second thickness T2 may have a thickness of about 3 µm to about 6 µm. In some embodiments, the redistribution line patterns 322 having a third line width W3 may be arranged on the first distribution layer LP1 at a third pitch P3. The third line width W3 and the third pitch P3 may be greater than the first line width W1 and the first pitch P1, respectively. In some embodiments, at least some of the redistribution line patterns 322 on the first distribution layer LP1 may include the plurality of redistribution upper surface pads, to which the plurality of first chip connection terminals 150 and the plurality of third chip connection terminals 450 described with reference to FIG. 1 are attached.

In some embodiments, the reference surface DL-TS1, which is a portion at the highest vertical level of the upper surface of the second insulation layer DL23, may be on the third distribution layer LP3, and may be on the redistribution line pattern 322 having the second line width W2 and the second line height T2. When a horizontal width of the reference surface DL-TS1, that is, a first horizontal width D1 illustrated in FIG. 3F, is less than the second line width W2, the reference surface DL-TS1 may be on the central portion of the redistribution line pattern 322, which is on the third distribution layer LP3 and has the second line width W2 and the second line height T2. In some embodiments, the third outer surface DL-TS4, which is a portion at the lowest vertical level of the upper surface of the second insulation layer DL23, may be arranged between the redistribution line patterns 322 on the third distribution layer LP3.

A first vertical level difference LD between a portion at the highest vertical level and a portion at the lowest vertical level of the upper surface of the second insulation layer DL23, that is, between the reference surface DL-TS1 and the third outer surface DL-TS4 may be less than the second thickness T2. Alternatively, the first vertical level difference LD between the portion at the highest vertical level and a portion at the lowest vertical level of the upper surface of the second insulation layer DL23 may be less than the first line width W1. In other words, the upper surface of the second insulation layer DL23 may have a vertical level difference less than the second thickness T2 of the redistribution line patterns 322 on the third distribution layer LP3 covered by the second insulation layer DL23. In addition, the upper surface of the second insulation layer DL23 may have a vertical level difference less than the first line width W1 of the redistribution line patterns 322, which are arranged on the second insulation layer DL23 and on the second distribution layer LP2. Accordingly, the redistribution line pattern 322 on the second distribution layer LP2 may be implemented as a fine pattern having the first line width W1 and the first pitch P1, which are relatively small.

Referring to FIG. 2B, the redistribution structure 300 may include the redistribution insulation layer 310 and the plurality of redistribution patterns 320. The upper surfaces of at least two redistribution insulation layers 310 of the plurality of redistribution insulation layers 310 may have a step shape, in which three or more portions thereof at different vertical levels from each other have or define two or more steps. For example, the upper surface of the second insulation layer DL23 and an upper surface of the fourth insulation layer DL45 of the plurality of redistribution insulation layers 310 may have a step shape, in which three or more portions thereof at different vertical levels have two or more steps. The shape of the upper surface of the second insulation layer DL23 and a shape of the upper surface of the fourth insulation layer DL45 may be generally similar to the shape of the upper surface of the second insulation layer DL23 described with reference to FIG. 2A, and thus, detailed descriptions thereof are omitted in the interest of brevity. In addition, respective relationships between a line width, a pitch, and a thickness of the redistribution line patterns 322 on the second distribution layer LP2 arranged on the upper surface of the second insulation layer DL23 and a line width, a pitch, and a thickness of the redistribution line patterns 322 on the third distribution layer LP3 covered by the second insulation layer DL23, and respective relationships between a line width, a pitch, and a thickness of the redistribution line patterns 322 on the fourth distribution layer LP4 arranged on the upper surface of the fourth insulation layer DL45 and a line width, a pitch, and a thickness of the redistribution line patterns 322 on the fifth distribution layer LP5 covered by the fourth insulation layer DL45 may be generally similar to respective relationships between a line width, a pitch, and a thickness of the redistribution line patterns 322 on the second distribution layer LP2 and a line width, a pitch, a thickness of the redistribution line patterns 322 on the third distribution layer LP3, which have been described with reference to FIG. 2A, and thus, detailed descriptions thereof are omitted in the interest of brevity. In some embodiments, at least some of the redistribution line patterns 322 on the third distribution layer LP3 may constitute a ground plane layer, to which a ground signal is provided, and at least some of the redistribution line patterns 322 on the second distribution layer LP2 may constitute a signal distribution line, to which a data signal, a control signal, or the like are provided. In addition, at least some of the redistribution line patterns 322 on the fifth distribution layer LP5 may constitute a ground plane layer, to which a ground signal is provided, and at least some of the redistribution line patterns 322 on the fourth distribution layer LP4 may constitute a signal distribution line, to which a data signal, a control signal, or the like are provided.

The redistribution line patterns 322 on the second distribution layer LP2 may be implemented as a fine pattern having a line width and a pitch, which are respectively less than a line width and a pitch of the redistribution line patterns 322 on the third distribution layer LP3, and the redistribution line patterns 322 on the fourth distribution layer LP4 may be implemented as a fine pattern having a line width and a pitch, which are respectively less than a line width and a pitch of the redistribution line patterns 322 on the fifth distribution layer LP5.

In FIG. 2B, it is illustrated that the shape of the upper surface of the second insulation layer DL23 is aligned with the shape of the upper surface of the fourth insulation layer DL45 in the vertical direction, but this is only for convenience of illustration, and the shape of the upper surface of the second insulation layer DL23 may be determined corresponding to the redistribution line patterns 322 on the third distribution layer LP3, and the shape of the upper surface of the fourth insulation layer DL45 may be determined corresponding to the redistribution line patterns 322 on the fifth distribution layer LP5, while the shape of the upper surface of the second insulation layer DL23 does not have a direct relationship with the shape of the upper surface of the fourth insulation layer DL45.

Figure 2C:
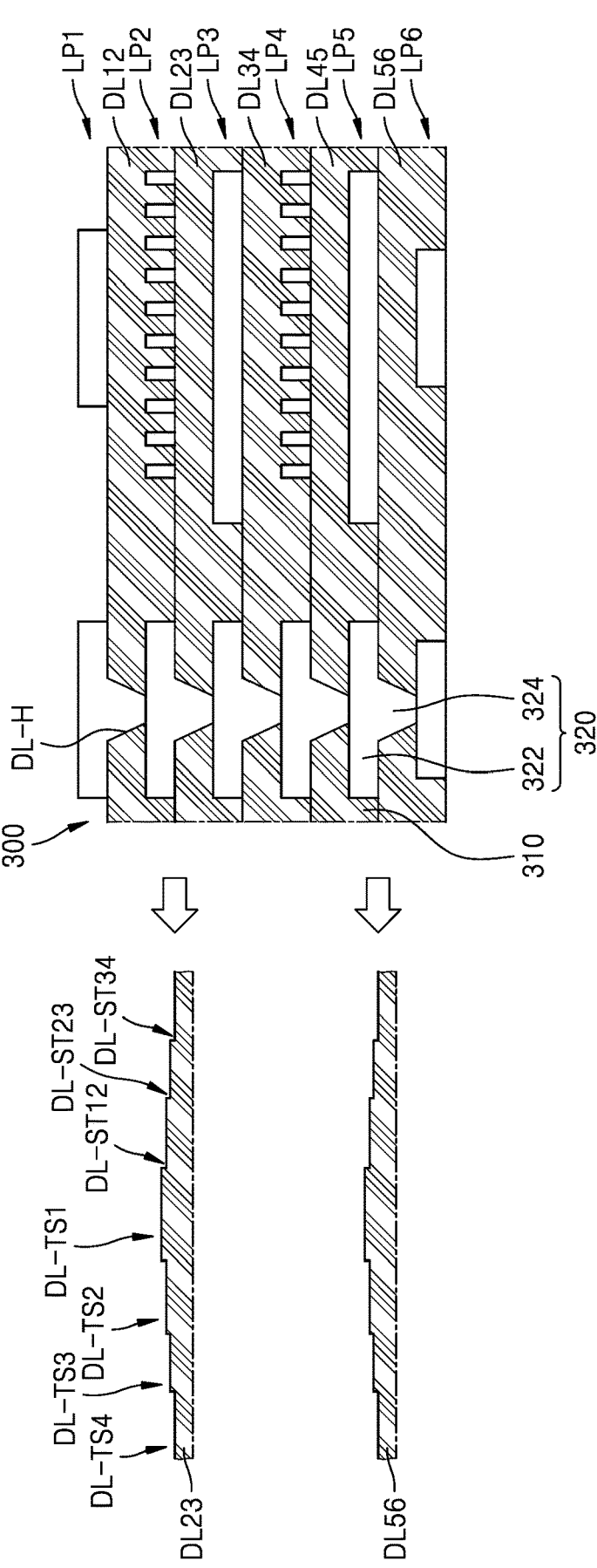

Referring to FIG. 2C, the redistribution structure 300 may include the redistribution insulation layer 310 and the plurality of redistribution patterns 320. The upper surfaces of at least two redistribution insulation layers 310 of the plurality of redistribution insulation layers 310 may have a step shape, in which three or more portions at different vertical levels from each other thereof have or define two or more steps. For example, the upper surface of the second insulation layer DL23 and an upper surface of the fifth insulation layer DL56 of the plurality of redistribution insulation layers 310 may have a step shape, in which three or more portions thereof at different vertical levels have two or more steps.

The shape of the upper surface of the second insulation layer DL23 and a shape of the upper surface of the fifth insulation layer DL56 may be generally similar to the shape of the upper surface of the second insulation layer DL23 described with reference to FIG. 2A, and thus, detailed descriptions thereof are omitted in the interest of brevity. In addition, respective relationships between the line width, the pitch, and the thickness of the redistribution line patterns 322 on the second distribution layer LP2 arranged on the upper surface of the second insulation layer DL23 and the line width, the pitch, and the thickness of the redistribution line patterns 322 on the third distribution layer LP3 covered by the second insulation layer DL23 may be generally similar to respective relationships between the line width, the pitch, and the thickness of the redistribution line patterns 322 on the second distribution layer LP2 and the line width, the pitch, and the thickness of the redistribution line patterns 322 on the third distribution layer LP3, which have been described with reference to FIG. 2A, and thus, detailed descriptions thereof are omitted in the interest of brevity.

In some embodiments, respective relationships between the line width, the pitch, and the thickness of the redistribution line patterns 322 on the fifth distribution layer LP5 arranged on the upper surface of the fifth insulation layer DL56 and the line width, the pitch, and the thickness of the redistribution line patterns 322 on the sixth distribution layer LP6 covered by the fifth insulation layer DL56 may be generally similar to respective relationships between the line width, the pitch, and the thickness of the redistribution line patterns 322 on the second distribution layer LP2 and the line width, the pitch, and the thickness of the redistribution line patterns 322 on the third distribution layer LP3, which have been described with reference to FIG. 2A, and thus, detailed descriptions thereof are omitted in the interest of brevity. For example, the redistribution line patterns 322 on the fifth distribution layer LP5 may extend in left and right directions in FIG. 2C, but may be implemented as a fine pattern compared to the redistribution line patterns 322 on the sixth distribution layer LP6.

In some other embodiments, respective relationships between the line width, the pitch, and the thickness of the redistribution line patterns 322 on the fifth distribution layer LP5 arranged on the upper surface of the fifth insulation layer DL56 and the line width, the pitch, and the thickness of the redistribution line patterns 322 on the sixth distribution layer LP6 covered by the fifth insulation layer DL56 may be different from respective relationships between the line width, the pitch, and the thickness of the redistribution line patterns 322 on the second distribution layer LP2 and the line width, the pitch, and the thickness of the redistribution line patterns 322 on the third distribution layer LP3, which have been described with reference to FIG. 2A. For example, the fifth insulation layer DL56 may be formed to have a step shape, in which three or more portions thereof at different vertical levels have two or more steps, so that a flatness of the upper surface of the fifth insulation layer DL56, which occurs in response to the redistribution line patterns 322 on the sixth distribution layer LP6, is improved.

In some embodiments, at least some of the redistribution line patterns 322 on the third distribution layer LP3 may constitute a ground plane layer, to which a ground signal is provided, and at least some of the redistribution line patterns 322 on the second distribution layer LP2 may constitute a signal distribution line, to which a data signal, a control signal, or the like are provided. In some embodiments, at least some of the redistribution line patterns 322 on the fifth distribution layer LP5 may constitute a signal distribution line, to which a data signal, a control signal, or the like are provided. In some other embodiments, at least some of the redistribution line patterns 322 on the fifth distribution layer LP5 may constitute a ground plane layer, to which a ground signal is provided.

In FIG. 2C, it is illustrated that the shape of the upper surface of the second insulation layer DL23 is aligned with the shape of the upper surface of the fifth insulation layer DL56, but this is only for convenience of illustration, and the shape of the upper surface of the second insulation layer DL23 may not have a direct relationship with the shape of the upper surface of the fifth insulation layer DL56.

Figure 2D:
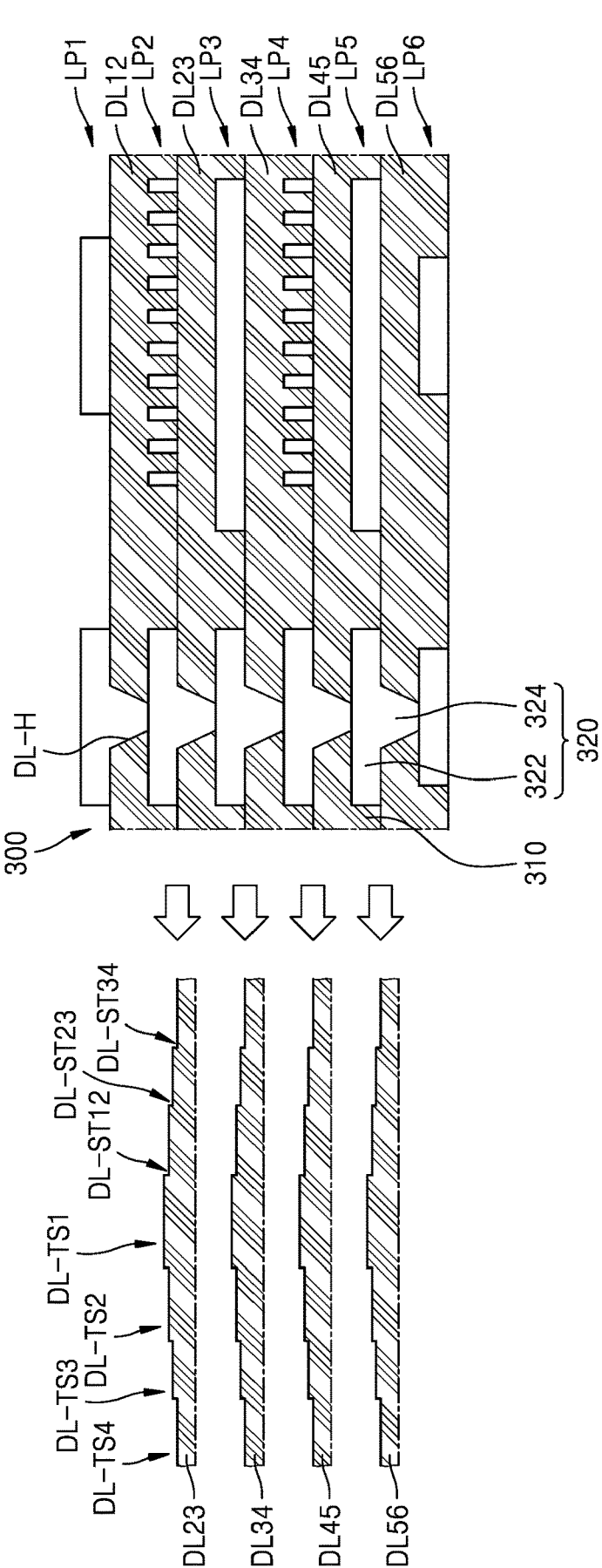

Referring to FIG. 2D, the redistribution structure 300 may include the redistribution insulation layer 310 and the plurality of redistribution patterns 320. The upper surfaces of the other redistribution insulation layers 310 except for at least one redistribution insulation layer 310 including the uppermost redistribution insulation layer 310 of the plurality of redistribution insulation layers 310 may have a step shape, in which three or more portions thereof at different vertical levels have or define two or more steps. For example, the upper surface of the second insulation layer DL23, the upper surface of the third insulation layer DL34, the upper surface of the fourth insulation layer DL45, and the upper surface of the fifth insulation layer DL56 of the plurality of redistribution insulation layers 310 may have a step shape, in which three or more portions thereof at different vertical levels have two or more steps.

The shape of the second insulation layer DL23, the shapes of the upper surface of the third insulation layer DL34, the upper surface of the fourth insulation layer DL45, and the upper surface of the fifth insulation layer DL56 may be generally similar to the shape of the upper surface of the second insulation layer DL23 described with reference to FIG. 2A, and thus, detailed descriptions thereof are omitted in the interest of brevity.

In FIG. 2D, it is illustrated that the shape of the upper surface of the second insulation layer DL23 is aligned with the shapes of the upper surface of the third insulation layer DL34, the upper surface of the fourth insulation layer DL45, and the upper surface of the fifth insulation layer DL56, but this is only for convenience of illustration, and the shape of the upper surface of the second insulation layer DL23 may not have a direct relationship with the shapes of the upper surface of the third insulation layer DL34, the upper surface of the fourth insulation layer DL45, and the upper surface of the fifth insulation layer DL56.

Because the redistribution structure 300 is formed such that a flatness of each of the upper surface of the second insulation layer DL23, the upper surface of the third insulation layer DL34, the upper surface of the fourth insulation layer DL45, and the upper surface of the fifth insulation layer DL56 is improved, the degree of freedom of design of the plurality of redistribution line patterns 322 may be improved, and the plurality of redistribution line patterns 322 may be implemented as a fine pattern.

FIGS. 3A through 3F are conceptual cross-sectional views illustrating a method of fabricating a redistribution structure included in a semiconductor package, according to example embodiments.

Figure 3A:
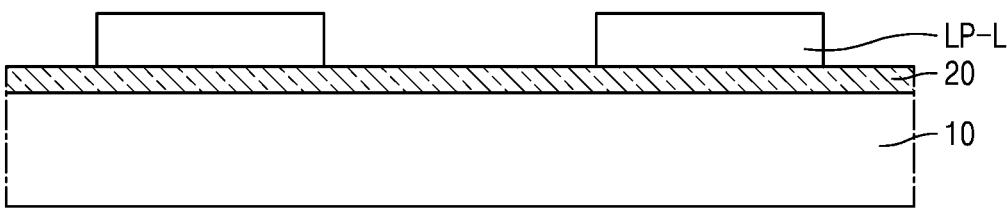
FIGS. 3A through 3F are conceptual cross-sectional views illustrating a method of fabricating a redistribution structure included in a semiconductor package, according to example embodiments.

Referring to FIG. 3A, lower redistribution line patterns LP-L may be formed on a support substrate 10, where a release film 20 is attached to an upper surface thereof. The release film 20 may include a single layer, or a multilayer structure including a release layer, which is attached to each of both surfaces of a backbone layer. The backbone layer may include, for example, thermoplastic polymer. The release layer may include, for example, copolymer of acryl and silicone.

The lower redistribution line patterns LP-L may include redistribution line patterns 322 on the distribution layers except for the uppermost distribution layer of the plurality of redistribution line patterns 322 illustrated in FIGS. 2A through 2D. For example, the lower redistribution line patterns LP-L may include the redistribution line patterns 322 on any one of the second distribution layer LP2, the third distribution layer LP3, the fourth distribution layer LP4, the fifth distribution layer LP5, and the sixth distribution layer LP6, which have been illustrated in FIGS. 2A through 2D. In FIG. 3A, it is illustrated that the lower redistribution line patterns LP-L are directly attached on the release film 20, but this is only an example, and is not limited thereto. Between the lower redistribution line patterns LP-L and the release film 20, at least one redistribution insulation layer 310 and the redistribution patterns 320 illustrated in FIGS. 2A through 2D may be further formed.

Figure 3B:
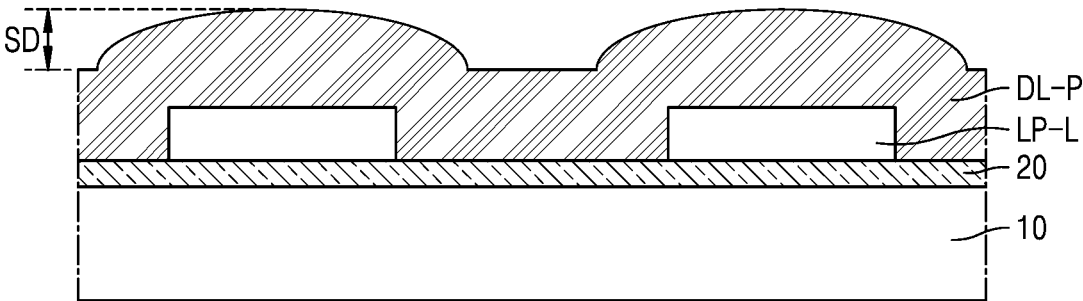

Referring to FIG. 3B, a preliminary insulation layer DL-P covering the lower redistribution line patterns LP-L may be formed. The preliminary insulation layer DL-P may have a sufficient thickness to cover all of side surfaces and upper surfaces of the lower redistribution line patterns LP-L. In addition, the preliminary insulation layer DL-P may include the PID material or PSPI. A space or distance between a portion at the highest vertical level and a portion at the lowest vertical level of the upper surface of the preliminary insulation layer DL-P may have a second vertical level difference SD.

Figure 3C:
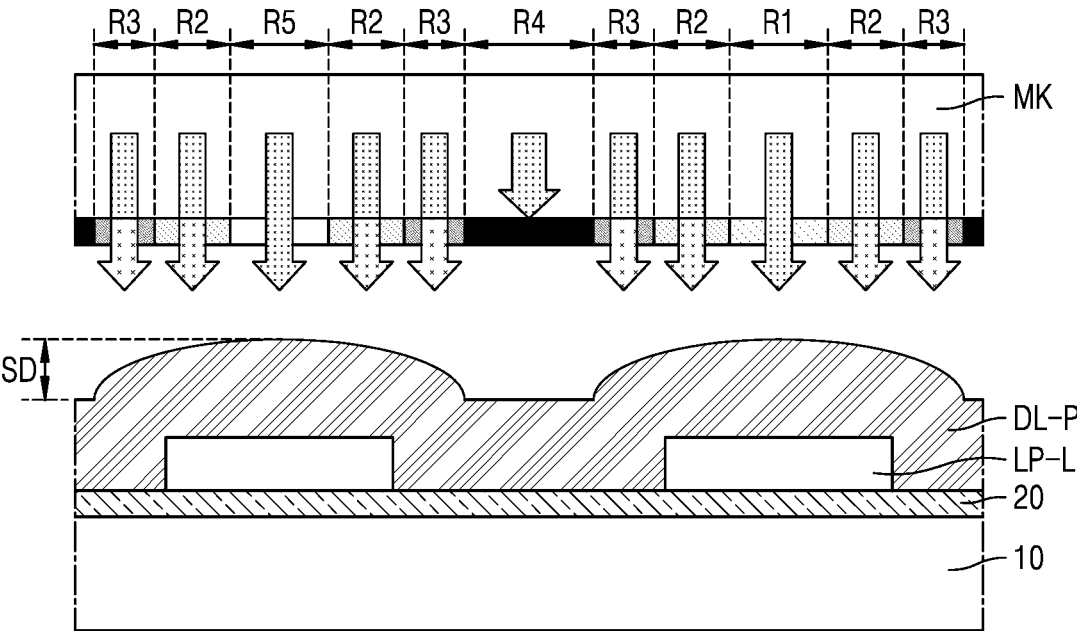

Referring to FIG. 3C, the preliminary insulation layer DL_P may be exposed by using a photo mask MK. The photo mask MK may have a plurality of regions having different transmittances from each other, with respect to a light source irradiating on the preliminary insulation layer DL_P through the photo mask MK. In FIG. 3C, the photo mask MK is illustrated as including five regions having different transmittances from each other, that is, a first region R1, a second region R2, a third region R3, a fourth region R4, and a fifth region R5, but is not limited thereto. For example, the photo mask MK may include four or more regions of different transmittances from each other. The fourth region R4 may have the lowest transmittance. The fifth region R5 may have the highest transmittance. In FIG. 3C, it is illustrated that transmittance of the fourth region R4 is about 0%, and transmittance of the fifth region R5 is about 100%, but only relative transmittances are illustrated, and is not limited thereto. Each of the first region R1, the second region R2, the third region R3, and the fourth region R4 may have sequentially different transmittances between transmittance of the fifth region R5 and transmittance of the fourth region R4. For example, transmittance of the first surface R1 may be less than transmittance of the fifth region R5, transmittance of the second surface R2 may be less than transmittance of the first surface R1, transmittance of the third region R3 may be less than transmittance of the second region R2, and transmittance of the fourth region R4 may be less than transmittance of the third region R3.

Each of the first region R1, the second region R2, the third region R3, and the fourth region R4 may correspond to from a portion of the preliminary insulation layer DL_P including an upper surface at a relatively high vertical level to a portion of the preliminary insulation layer DL_P including an upper surface at a relatively low vertical level, and the fifth region R5 may correspond to the redistribution through hole DL-H illustrated in FIGS. 2A through 2D.

When the preliminary insulation layer DL-P is of a positive type, solubility of the preliminary insulation layer DL-P exposed by a light source irradiated through the photo mask MK may decrease in a sequence of portions of the preliminary insulation layer DL-P, which respectively correspond to the fifth region R5, the first region R1, the second region R2, the third region R3, and the fourth region R4. For example, solubility of the preliminary insulation layer DL-P exposed by a light source irradiated through the photo mask MK may be lowest at a portion of the preliminary insulation layer DL-P corresponding to the fifth region R5, and highest at a portion of the preliminary insulation layer DL-P corresponding to the fourth region R4.

Figure 3D:
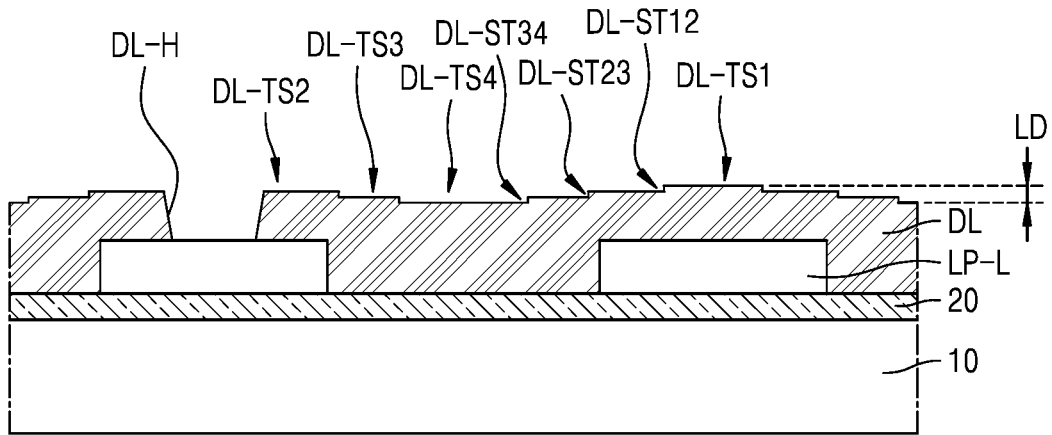

Referring to FIGS. 3C and 3D together, an insulation layer DL may be formed from the preliminary insulation layer DL-P, by performing an exposure process and a development process on the preliminary insulation layer DL-P through the photo mask MK. For example, the insulation layer DL may include any one of the second insulation layer DL23, the third insulation layer DL34, the fourth insulation layer DL45, and the fifth insulation layer DL56 illustrated in FIGS. 2A through 2D.

The insulation layer DL may include a reference surface DL-TS1 and an upper surface including at least two outer surfaces, for example, DL-TS2, DL-TS3, and DL-TS4, which include at least two steps, for example, the first, second, and third steps DL-ST12, DL-ST23, and DL-ST34, from the reference surface DL-TS1 toward the outside in the horizontal direction, at step-down vertical levels, and may include the redistribution through hole DL-H, which penetrates the insulation layer DL and exposes a portion of the lower redistribution line pattern LP-L at a bottom surface thereof. A shape of the upper surface of the insulation layer DL may be generally similar to the shape of the upper surface of the second insulation layer DL23 described with reference to FIG. 2A, and thus, detailed descriptions thereof are omitted in the interest of brevity.

A space between a portion at the highest vertical level and a portion at the lowest vertical level of the upper surface of the insulation layer DL may have the first vertical level difference LD. The first vertical level difference LD may be less than the second vertical level difference SD. Accordingly, the insulation layer DL may be formed to improve a flatness of the upper surface thereof compared to the preliminary insulation layer DL-P, by using the photo mask MK for forming the redistribution through hole DL-H. Accordingly, without using a discrete photo mask MK and performing a discrete process, a flatness of the upper surface of the insulation layer DL may be improved, a manufacturing process may be simplified, and manufacturing cost may be reduced.

Figure 3E:
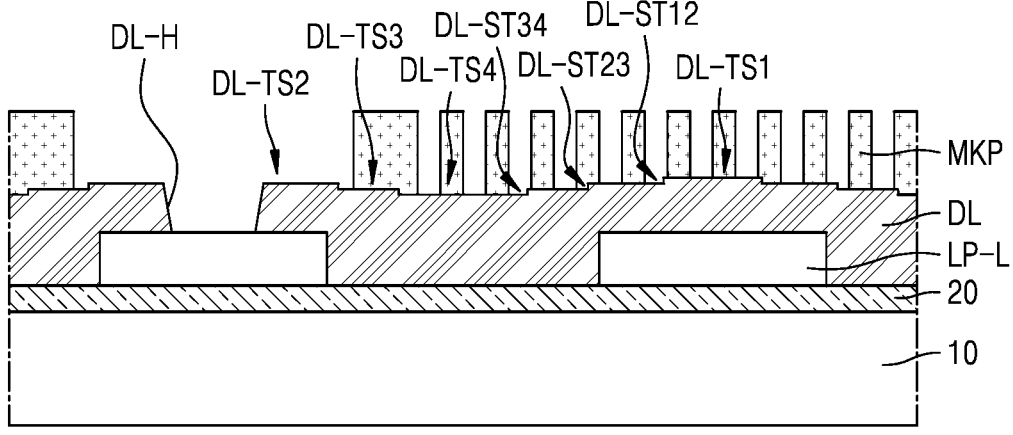
Figure 3F:
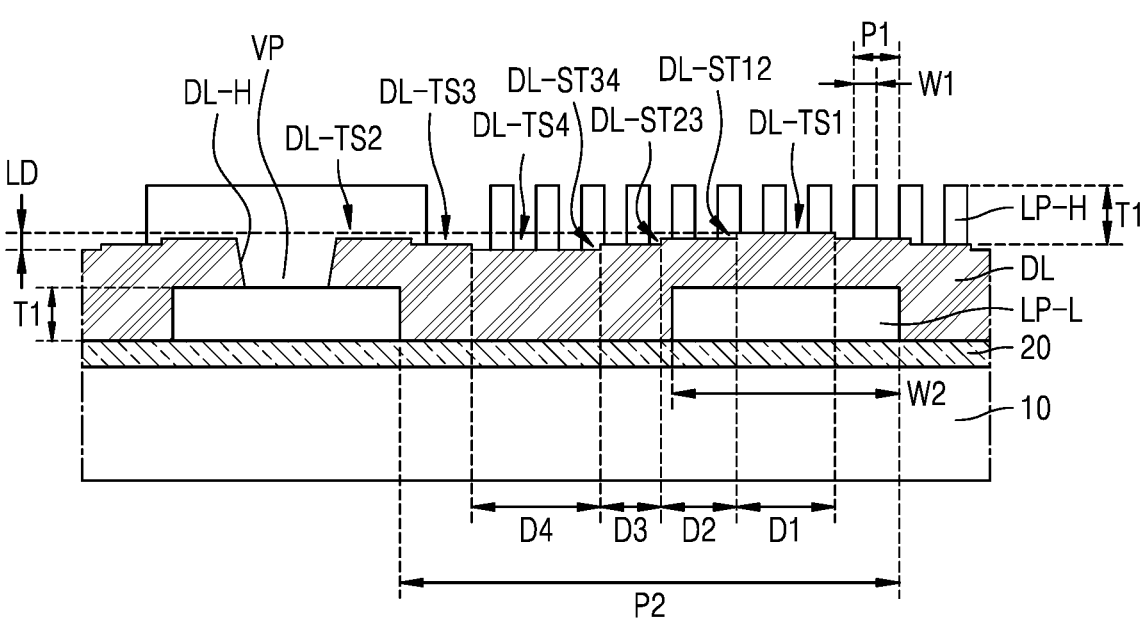

Referring to FIG. 3E, a plurality of mask patterns MKP may be formed on the insulation layer DL. Because the upper surface of the insulation layer DL has a relatively improved flatness, the plurality of mask patterns MKP may be formed fine.

Referring to FIGS. 3E and 3F, after a preliminary conductive material layer is formed on the plurality of mask patterns MKP, by performing a lift off process for removing the plurality of mask patterns MKP, a plurality of upper redistribution line patterns LP-H and at least one via pattern VP may be formed. The plurality of upper redistribution line patterns LP-H may include the redistribution line patterns 322 on the distribution layers except for the distribution layer at the uppermost end and the distribution layer at the lowermost end of the plurality of redistribution line patterns 322 illustrated in FIGS. 2A through 2D. For example, the plurality of upper redistribution line patterns LP-H may include the redistribution line patterns 322 on any one of the second distribution layer LP2, the third distribution layer LP3, the fourth distribution layer LP4, and the fifth distribution layer LP5 illustrated in FIGS. 2A through 2D. At least one via pattern VP may include some of the plurality of redistribution vias 324 illustrated in FIGS. 2A through 2D.

Horizontal widths of the reference surface DL-TS1 and each of at least two outer surfaces, for example, DL-TS2, DL-TS3, and DL-TS4, which include at least two steps, for example, the first, second, and third steps DL-ST12, DL-ST23, and DL-ST34, from the reference surface DL-TS1 toward the outside in the horizontal direction, at step-down vertical levels, that is, a first horizontal width D1, a second horizontal width D2, a third horizontal width D3, and a fourth horizontal width D4 of the reference surface DL-TS1, the first outer surface DL-TS2, the second outer surface DL-TS3, and the third outer surface DL-TS4, respectively, may be greater than the first horizontal width W1, and less than the second horizontal width W2. For example, each of the first horizontal width D1, the second horizontal width D2, the third horizontal width D3, and the fourth horizontal width D4 may have a value measured in the same horizontal direction as the second horizontal width W2.

Because the upper surface of the insulation layer DL has a first vertical level difference LD having a relatively improved flatness, and the first horizontal width D1, the second horizontal width D2, the third horizontal width D3, and the fourth horizontal width D4 of the reference surface DL-TS1, the first outer surface DL-TS2, the second outer surface DL-TS3, and the third outer surface DL-TS4 of the upper surface of the insulation layer DL, relatively, are greater than the first horizontal width W1 and less than the second horizontal width W2, the plurality of upper redistribution line patterns LP-H arranged on the insulation layer DL may be implemented as a fine pattern.

Figure 4:
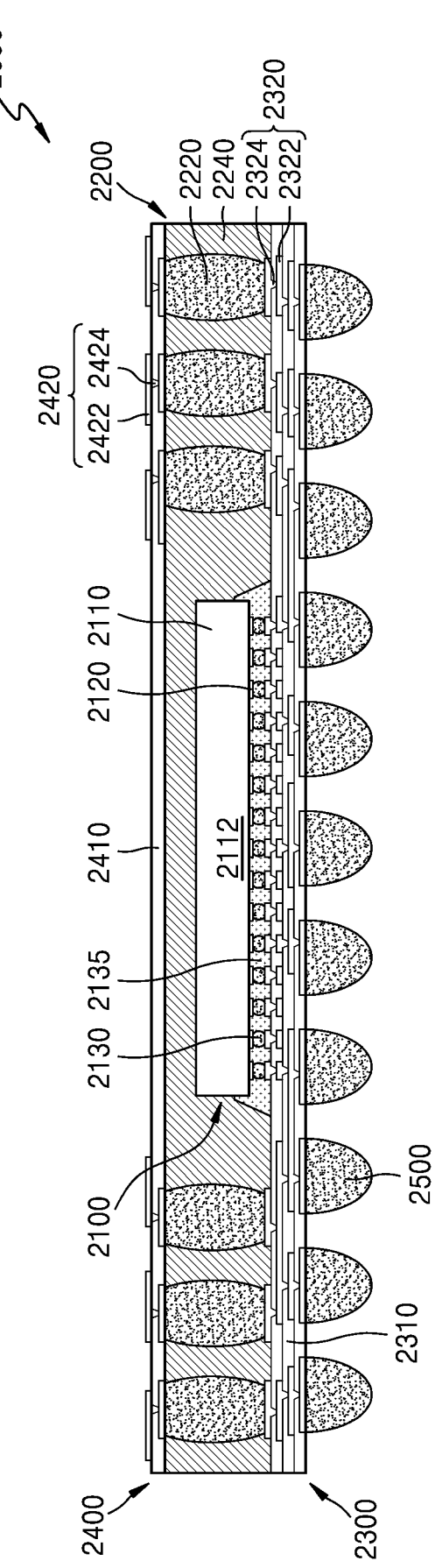
FIG. 4 is a cross-sectional view of a semiconductor package according to an example embodiment.

FIG. 4 is a cross-sectional view of a semiconductor package 2000 according to an example embodiment.

Referring to FIG. 4, the semiconductor package 2000 may include a redistribution structure 2300, an expansion layer 2200 arranged on the redistribution structure 2300, at least one semiconductor chip 2100 arranged in the expansion layer 2200, and a cover distribution layer 2400 arranged on the expansion layer 2200. The expansion layer 2200 may surround the periphery of the semiconductor chip 2100. The semiconductor package 2000 may include a fan out semiconductor package in which a horizontal width and a horizontal area of the redistribution structure 2300 are respectively greater than a horizontal width and a horizontal area of a footprint constituted by at least one semiconductor chip 2100. In some embodiments, the semiconductor package 2000 may include a fan-out wafer level package (FOWLP). Each of the redistribution structure 2300 and the cover distribution layer 2400 may be referred to as a lower redistribution structure and an upper redistribution structure, respectively.

The redistribution structure 2300 may include a redistribution insulation layer 2310 and a plurality of redistribution patterns 2320. The plurality of redistribution patterns 2320 may include the plurality of redistribution line patterns 2322 and the plurality of redistribution vias 2324. The redistribution insulation layer 2310, and the redistribution structure 2300 including the plurality of redistribution patterns 2320 may be generally similar to the redistribution insulation layer 310, and the redistribution structure 300 including the plurality of redistribution patterns 320 described with reference to FIG. 1, and thus, detailed descriptions thereof are omitted in the interest of brevity. A plurality of external connection terminals 2500 electrically connected to the plurality of redistribution patterns 2320 may be attached to a lower surface of the redistribution structure 2300.

At least one semiconductor chip 2100 may include a semiconductor substrate 2110, in which a semiconductor element 2112 is formed on an active surface thereof, and a plurality of chip connection pads 2120 arranged on the active surface of the semiconductor substrate 2110. The semiconductor chip 2100 may be generally similar to any one of the first bonding semiconductor chip 100, the second semiconductor device 200, and the third semiconductor chip 400 described with reference to FIG. 1, and thus, detailed descriptions thereof are omitted in the interest of brevity. The semiconductor chip 2100 may include, for example, a central processing unit (CPU) chip, a graphics processing unit (GPU) chip, or an application processor (AP) chip.

A plurality of chip connection terminals 2130 may be arranged under the plurality of chip connection pads 2120, and electrically connect the at least one semiconductor chip 2100 to the redistribution structure 2300. An underfill layer 2135 surrounding the plurality of chip connection terminals 2130 may be arranged between the at least one semiconductor chip 2100 and the redistribution structure 2300.

In some embodiments, when the semiconductor package 2000 includes a lower package of a package on package (PoP), the semiconductor package 2000, the semiconductor chip 2100, the semiconductor substrate 2110, the semiconductor element 2112, a chip connection pad 2120, a chip connection terminal 2130, and an underfill layer 2315 may be referred to as a lower package, a lower semiconductor chip, a lower semiconductor substrate, a lower semiconductor element, a lower chip connection pad, a lower chip connection terminal, and a lower underfill layer, respectively.

The expansion layer 2200 may include a filling unit or filling layer 2240 surrounding a plurality of connection structure 2220 and the at least one semiconductor chip 2100. The plurality of connection structure 2220 may penetrate the filling unit 2240, and electrically connect the redistribution structure 2300 and the cover distribution layer 2400. Each of the plurality of connection structure 2220 may include a through mold via (TMV), a conductive solder, a conductive pillar, or at least one conductive bump.

The filling unit 2240 may include, for example, EMC. The filling unit 2240 may surround the semiconductor chip 2100. In some embodiments, the filling unit 2240 may cover or surround side surfaces and an inactive surface of at least one semiconductor chip 100.

The cover distribution layer 2400 may include at least one base insulation layer 2410 and a distribution structure 2420. The distribution structure 2420 may include a plurality of distribution patterns 2422 arranged on at least one of an upper surface and a lower surface of at least one redistribution insulating layer 2410, and a plurality of conductive vias 2424 penetrating at least one redistribution insulating layer 2410 and being in contact with and connected to some of the plurality of distribution patterns 2422.

The redistribution structure 2300 may include a plurality of redistribution insulation layers 2310. A shape of some of the plurality of redistribution insulation layers 2310, for example, a shape of an upper surface of at least one of remaining redistribution insulation layers 2310 except for the uppermost redistribution insulation layer 2310 of the plurality of redistribution insulation layers 2310 may be generally similar to the shape of the upper surface of the second insulation layer DL23 described with reference to FIG. 2A, and thus, detailed descriptions thereof are omitted in the interest of brevity.

Figure 5:
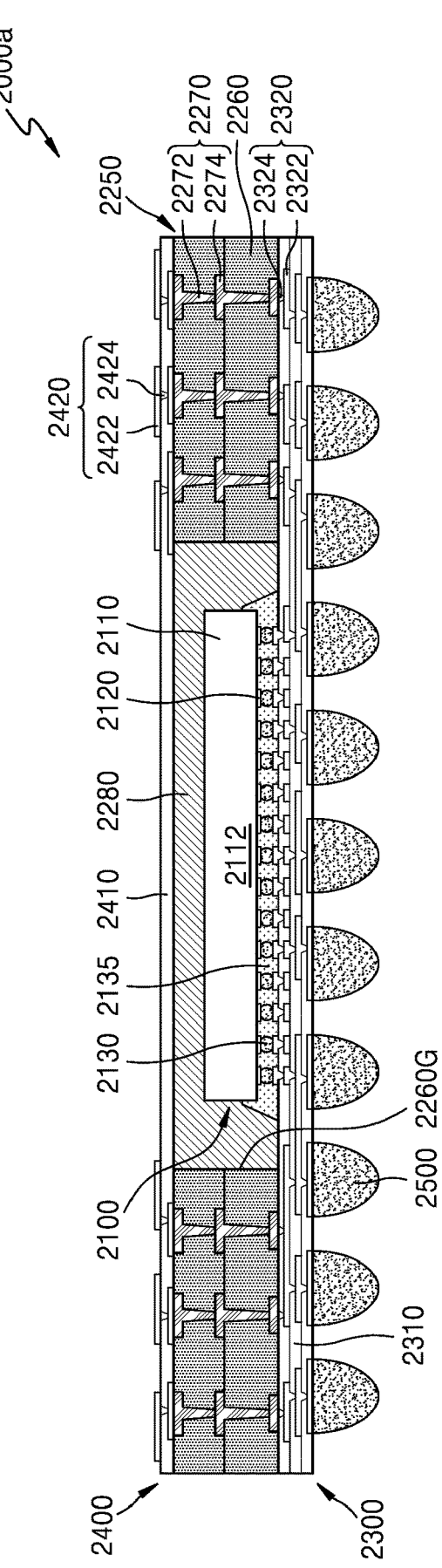
FIG. 5 is a cross-sectional view of a semiconductor package according to an example embodiment.

FIG. 5 is a cross-sectional view of a semiconductor package 2000a according to an example embodiment. In FIG. 5, identical member numbers in FIG. 4 may represent identical members, and thus, duplicate descriptions thereof may be omitted in the interest of brevity.

Referring to FIG. 5, the semiconductor package 2000a may include the redistribution structure 2300, an expansion layer 2250 arranged on the redistribution structure 2300 and including a mounting space 2260G, at least one semiconductor chip 2100 arranged in the mounting space 2260G of the expansion layer 2250, and a cover distribution layer 2400 arranged on the expansion layer 2250. The expansion layer 2250 may surround the periphery of the semiconductor chip 2100. The semiconductor package 2000a may include a fan-out semiconductor package. In some embodiments, the expansion layer 2250 may include a panel board, and the semiconductor package 2000a may include a fan-out panel level package (FOPLP). In some embodiments, a horizontal width and a horizontal area of the mounting space 2260G may be greater than those of a footprint generated by the semiconductor chip 2100. The side surfaces of the semiconductor chip 2100 may be spaced apart from inside or inner surfaces of the mounting space 2260G.

The semiconductor package 2000a may further include a filling insulation layer 2280 filling a space between the semiconductor chip 2100 and the expansion layer 2250. For example, the filling insulation layer 2280 may be formed of thermosetting resin such as epoxy resin, thermoplastic resin such as polyimide, or resin including an adder such as an inorganic filler added thereto, for example, Ajinomoto build-up film (ABF), FR-4, BT, etc. Alternatively, the filling insulation layer 2280 may include a molding material such as EMC or a photosensitive material such as a photoimageable encapsulant (PIE).

The expansion layer 2250 may include, for example, a printed circuit board, a ceramic substrate, a package manufacturing wafer, or an interposer. In some embodiments, the expansion layer 2250 may include a multi-layer printed circuit board. The mounting space 2260G may be formed as an opening or a cavity in the expansion layer 2250. The mounting space 2260G may be formed in some region, for example, at the center region of the expansion layer 2250. The mounting space 2260G may be recessed from an upper surface of the expansion layer 2250 to a certain depth, or may be formed open.

The expansion layer 2250 may include at least one substrate base 2260 and a connection structure 2270. The connection structure 2270 may include a connection distribution pattern 2272 and a connection conductive via 2274.

The redistribution structure 2300 may include a plurality of redistribution insulation layers 2310. A shape of some of the plurality of redistribution insulation layers 2310, for example, a shape of an upper surface of at least one of remaining redistribution insulation layers 2310 except for the uppermost redistribution insulation layer 2310 of the plurality of redistribution insulation layers 2310 may be generally similar to the shape of the upper surface of the second insulation layer DL23 described with reference to FIG. 2A, and thus, detailed descriptions thereof are omitted in the interest of brevity.

Figure 6:
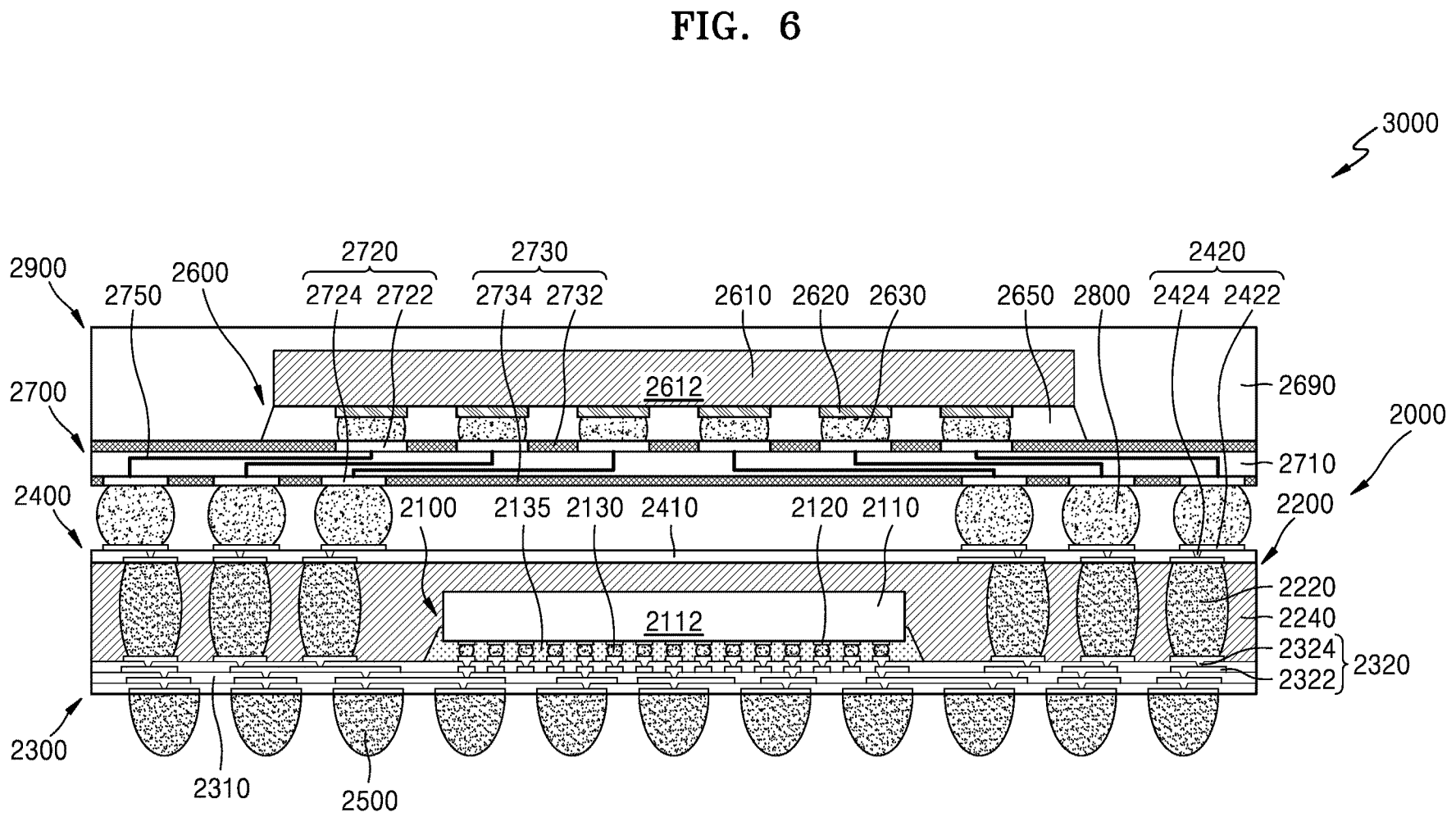

FIG. 6 is a cross-sectional view of the semiconductor package 3000 of a package on package type, according to an example embodiment.

Referring to FIG. 6, the semiconductor package 3000 of a package on package type may include an upper semiconductor package 2900 stacked on the lower semiconductor package 2000. The lower semiconductor package 2000 may be substantially the same as the upper semiconductor package 2000 described with reference to FIG. 4, and thus, detailed descriptions thereof are omitted in the interest of brevity.

The upper semiconductor package 2900 may include at least one upper semiconductor chip 2600. The upper semiconductor package 2900 may be electrically connected to the lower semiconductor package 2000 via a package connection terminal 2800.

The upper semiconductor chip 2600 may include an upper semiconductor substrate 2610, under which an upper semiconductor element 2612 is formed on an active surface thereof, and a plurality of upper chip connection pads 2620 arranged on the active surface of the upper semiconductor substrate 2610. The upper semiconductor chip 2600 may be generally similar to any one of the first bonding semiconductor chip 100, the second semiconductor device 200, and the third semiconductor chip 400 described with reference to FIG. 1, and thus, detailed descriptions thereof are omitted in the interest of brevity.

The upper semiconductor chip 2600 may include a memory semiconductor chip. The upper semiconductor chip 2600 may include, for example, a dynamic random access memory (RAM) (DRAM) chip, a static RAM (SRAM) chip, a flash memory chip, an erasable programmable read-only memory (ROM) (EPROM) chip, a phase-change RAM (PRAM) chip, a magnetic RAM (MRAM) chip, or a resistive RAM (RRAM) chip.

In FIG. 6, it is illustrated that at least one upper semiconductor chip 2600 included in the upper semiconductor package 2900 is mounted on a package base substrate 2700 in a flip chip method, but this is only an example and is not limited thereto. The semiconductor package 3000 may include, as an upper semiconductor package, semiconductor packages of all types, which include at least one upper semiconductor chip 2600, and the package connection terminal 2800 to be electrically connected to the lower semiconductor package 2000 on a lower side thereof.

The package base substrate 2700 may include a base board layer 2710, and a plurality of board pads 2720 arranged on an upper surface and a lower surface of the base board layer 2710. The plurality of board pads 2720 may include a plurality of board upper surface pads 2722 arranged on the upper surface of the base board layer 2710 and a plurality of board lower pads 2724 arranged on the lower surface of the base board layer 2710. In some embodiments, the package base substrate 2700 may include a printed circuit board.

On the upper and lower surfaces of the base board layer 2710, a board solder resist layer 2730 exposing the plurality of board pads 2720 may be formed. The board solder resist layer 2730 may include an upper surface board solder resist layer 2732, which covers the upper surface of the base board layer 2710 and exposes the plurality of board upper surface pads 2722, and a lower surface board solder resist layer 2734, which covers the lower surface of the base board layer 2710 and exposes the plurality of board lower surface pads 2724.

The package base substrate 2700 may include board wirings 2750 electrically connecting the plurality of board upper surface pads 2722 and the plurality of board lower surface pads 2724 inside the base board layer 2710. The plurality of board upper surface pads 2722 may be electrically connected to the upper semiconductor chip 2600. For example, a plurality of upper chip connection terminals 2630 may be arranged between the plurality of upper chip connection pads 2620 and the plurality of board upper surface pads 2722 of the package base substrate 2700, and may electrically connect the upper semiconductor chip 2600 to the package base substrate 2700. In some embodiments, an upper under-fill layer 2650 surrounding the plurality of upper chip connection terminals 2630 may be arranged between the upper semiconductor chip 2600 and the package base substrate 2700.

A molding layer 2690 surrounding the upper semiconductor chip 2600 may be arranged on the package base substrate 2700. The molding layer 2690 may include, for example, EMC.

Figure 7:
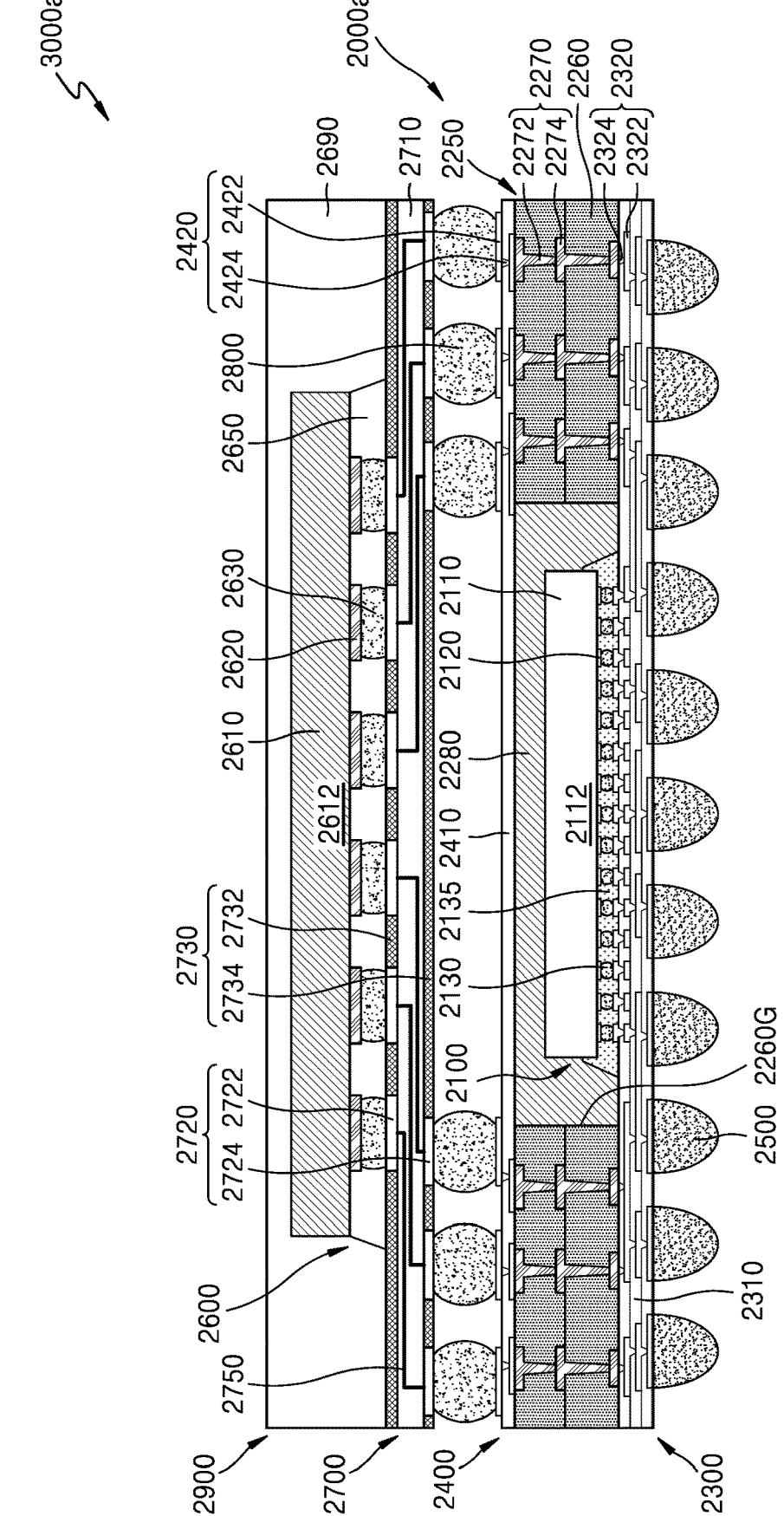
FIG. 7 is a cross-sectional view of a semiconductor package of a package on package type, according to an example embodiment.

FIG. 7 is a cross-sectional view of a semiconductor package 3000a of a package on package type, according to an example embodiment.

Referring to FIG. 7, the semiconductor package 3000a of a package on package type may include the upper semiconductor package 2900 stacked on the lower semiconductor package 2000a. The lower semiconductor package 2000a may be substantially the same as the semiconductor package 2000a described with reference to FIG. 5, and the upper semiconductor package 2900 may be substantially the same as the upper semiconductor package 2900 described with reference to FIG. 6, and thus, detailed descriptions thereof are omitted in the interest of brevity.

While the inventive concept has been particularly shown and described with reference to embodiments thereof, it will be understood that various changes in form and details may be made therein without departing from the scope of the following claims.

What is claimed is:

1. A semiconductor package comprising:
a redistribution structure comprising a plurality of distribution layers at different vertical levels from each other, the plurality of distribution layers comprising a plurality of redistribution insulation layers, which are stacked, and a plurality of redistribution line patterns on upper and lower surfaces of the plurality of redistribution insulation layers, the redistribution structure further comprising a plurality of redistribution vias that penetrate at least one of the plurality of redistribution insulation layers and are connected to some of the plurality of redistribution line patterns; and
at least one semiconductor chip on the redistribution structure and electrically connected to the plurality of redistribution line patterns and the plurality of redistribution vias,
wherein the plurality of redistribution line patterns comprise a plurality of upper redistribution line patterns on a first distribution layer of the plurality of distribution layers and lower redistribution line patterns on a second redistribution layer of the plurality of distribution layers at a lower vertical level than the first distribution layer, and
wherein at least one of the plurality of redistribution insulation layers covers the lower redistribution line patterns, and comprises an upper surface comprising a reference surface, a first outer surface extending away from the reference surface and having a lower vertical level than the reference surface, a first downward step between the reference surface and the first outer surface, a second outer surface extending away from the first outer surface and having a lower vertical level than the first outer surface, and a second downward step between the first outer surface and the second outer surface.

2. The semiconductor package of claim 1,
wherein the plurality of redistribution insulation layers comprise an uppermost first insulation layer of the plurality of redistribution insulation layers and a second insulation layer covering the lower redistribution line patterns, and the first insulation layer covers the plurality of upper redistribution line patterns on the second insulation layer.

3. The semiconductor package of claim 2,
wherein the plurality of upper redistribution line patterns comprise a first line width and a first pitch, and the lower redistribution line patterns comprise a second line width greater than the first line width and a second pitch greater than the first pitch.

4. The semiconductor package of claim 3,
wherein a horizontal width of each of the reference surface, the first outer surface, and the second outer surface is greater than the first line width and less than the second line width.

5. The semiconductor package of claim 3,
wherein a vertical level difference between a portion at a highest vertical level and a portion at a lowest vertical level of an upper surface of the second insulation layer is less than the first line width.

6. The semiconductor package of claim 3,
wherein a vertical level difference between a portion at a highest vertical level and a portion at a lowest vertical level of an upper surface of the second insulation layer is less than a thickness of the lower redistribution line patterns.

7. The semiconductor package of claim 2,
wherein the plurality of upper redistribution line patterns constitute a signal distribution line, and at least some of the lower redistribution line patterns constitute a ground plane layer, to which a ground signal is provided.

8. The semiconductor package of claim 7,
wherein an outer surface at a lowest vertical level of an upper surface of the second insulation layer is in a space between the lower redistribution line patterns.

9. The semiconductor package of claim 1,
wherein the reference surface is on a central portion of any one of the lower redistribution line patterns.

10. The semiconductor package of claim 6,
wherein the at least one semiconductor chip comprises a plurality of front surface connection pads connected to a plurality of chip connection terminals, and the plurality of chip connection terminals are connected to some of the plurality of redistribution line patterns, which are on a third distribution layer at a higher vertical level than the first distribution layer of the plurality of distribution layers, and include a third line width greater than the first line width and a third pitch greater than the first pitch.

11. A semiconductor package comprising:
a redistribution structure comprising a plurality of redistribution insulation layers, which are stacked and include a first insulation layer which is an uppermost one of the plurality of redistribution insulation layers and a second insulation layer under the first insulation layer, a plurality of redistribution line patterns constituting a plurality of distribution layers comprising a first distribution layer on an upper surface of the first insulation layer, a second distribution layer between the first insulation layer and the second insulation layer, and a third distribution layer arranged on a lower surface of the second insulation layer, and a plurality of redistribution vias that penetrate at least one of the plurality of redistribution insulation layers and are connected to some of the plurality of redistribution line patterns;

at least one stacked structure on the redistribution structure, and comprising a first semiconductor chip and a plurality of second semiconductor chips stacked on the first semiconductor chip; and a third semiconductor chip on the redistribution structure and spaced apart from the at least one stacked structure in a horizontal direction, wherein an upper surface of the second insulation layer has a stepped shape, in which three or more portions at different vertical levels from each other have steps therebetween.

12. The semiconductor package of claim 11, wherein, of the plurality of redistribution line patterns, a plurality of upper redistribution line patterns on the second distribution layer comprise a first line width and a first pitch, and a plurality of lower redistribution line patterns on the third distribution layer comprise a second line width greater than the first line width and a second pitch greater than the first pitch.

13. The semiconductor package of claim 12, wherein, of the plurality of redistribution line patterns, the upper surface of the second insulation layer comprises a reference surface, a first outer surface extending away from the reference surface and having a lower vertical level than the reference surface, a first downward step between the reference surface and the first outer surface, a second outer surface extending away from the first outer surface and having a lower vertical level than the first outer surface, and a second downward step between the first outer surface and the second outer surface, and wherein a horizontal width of each of the reference surface, the first outer surface, and the second outer surface is greater than the first line width, and less than the second line width.

14. The semiconductor package of claim 13, wherein the reference surface is on a central portion of any one of the lower redistribution line patterns, and an outer surface at a lowest vertical level of the upper surface of the second insulation layer is in a space between the lower redistribution line patterns.

15. The semiconductor package of claim 12, wherein the second line width and the second pitch are more than about 10 times larger than the first line width and the first pitch, respectively.

16. The semiconductor package of claim 12, wherein a thickness of the lower redistribution line patterns is greater than a vertical level difference between a portion at a highest vertical level and a portion at a lowest vertical level of the upper surface of the second insulation layer.

17. The semiconductor package of claim 11, wherein the plurality of redistribution insulation layers further comprise a fourth insulation layer at a lowest end thereof, a fifth insulation layer on the fourth insulation layer, and a sixth insulation layer on the fifth insulation layer, and at least one upper surface of the fifth insulation layer and the sixth insulation layer has a stepped shape, in which three or more portions at different vertical levels from each other have steps therebetween.

18. A semiconductor package comprising:

a package base substrate;

a redistribution structure comprising a plurality of redistribution insulation layers, which are stacked on the package base substrate, a first distribution layer on an upper surface of a first insulation layer that is uppermost of the plurality of redistribution insulation layers, a second distribution layer between the first insulation layer and a second insulation layer under the first insulation layer of the plurality of redistribution insulation layers, a plurality of redistribution line patterns constituting a plurality of distribution layers comprising a third distribution layer on a lower surface of the second insulation layer, and a plurality of redistribution vias that penetrate at least one redistribution insulation layer of the plurality of redistribution insulation layers and are connected to some of the plurality of redistribution line patterns;

at least one stacked structure comprising a first semiconductor chip on the redistribution structure and comprising a plurality of first front surface connection pads, and a plurality of second semiconductor chips stacked on the first semiconductor chip;

a third semiconductor chip spaced apart from the at least one stacked structure in a horizontal direction, on the redistribution structure, and comprising a plurality of second front surface connection pads; and a plurality of redistribution upper surface pads on the first distribution layer, of the plurality of redistribution line patterns, and a plurality of first chip connection terminals and a plurality of second chip connection terminals respectively disposed between the plurality of first front surface connection pads and the plurality of second front surface connection pads, wherein an upper surface of the second insulation layer comprises a reference surface on a central portion of any one of the lower redistribution line patterns, a first outer surface extending away from the reference surface and having a lower vertical level than the reference surface, a first downward step between the reference surface and the first outer surface, a second outer surface extending away from the first outer surface and having a lower vertical level than the first outer surface, a second downward step between the first outer surface and the second outer surface, a third outer surface extending away from the second outer surface and having a lower vertical level than the second outer surface, and a third downward step between the second outer surface and the third outer surface.

19. The semiconductor package of claim 18, wherein the third outer surface has a lowest vertical level of the upper surface of the second insulation layer and is in a space between the lower redistribution line patterns, and a vertical level difference between the reference surface and the third outer surface is less than a thickness of the lower redistribution line patterns.

20. The semiconductor package of claim 18, wherein, of the plurality of redistribution line patterns, a plurality of upper redistribution line patterns on the second distribution layer have a first line width of about 1 μm to about 4 μm, and a first pitch of about 1 μm to about 4 μm, a plurality of lower redistribution line patterns on the third distribution layer have a second line width more than about 10 times larger than the first line width and a second pitch more than about 10 times larger than the first pitch, and a horizontal width of each of the reference surface, the first outer surface, the second outer surface, and the third outer surface is greater than the first line width, and less than the second line width.

* * * * *